US012628371B2

(12) United States Patent
Kim et al.

(10) Patent No.: US 12,628,371 B2
(45) Date of Patent: May 12, 2026

(54) SEMICONDUCTOR DEVICE AND METHOD OF MANUFACTURING THE SEMICONDUCTOR DEVICE

(71) Applicant: SAMSUNG ELECTRONICS CO., LTD., Suwon-si (KR)

(72) Inventors: Choongsun Kim, Suwon-si (KR); Shigenobu Maeda, Seongnam-si (KR); Myoungkyu Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 695 days.

(21) Appl. No.: 17/819,936

(22) Filed: Aug. 15, 2022

(65) Prior Publication Data

US 2023/0143543 A1 May 11, 2023

(30) Foreign Application Priority Data

Nov. 5, 2021 (KR) ........................ 10-2021-0151325

(51) Int. Cl.
*H10D 30/62* (2025.01)
*H10D 64/01* (2025.01)
(52) U.S. Cl.
CPC ....... *H10D 30/6211* (2025.01); *H10D 64/017* (2025.01); *H10D 64/021* (2025.01)
(58) Field of Classification Search
CPC . H10D 30/6211; H10D 64/017; H10D 64/021
See application file for complete search history.

(56) References Cited

U.S. PATENT DOCUMENTS

| | | | |
|---|---|---|---|
| 8,614,484 B2 | 12/2013 | Teo et al. | |
| 8,637,929 B2 | 1/2014 | Satoh et al. | |
| 8,841,725 B2 | 9/2014 | Shima | |
| 9,093,492 B2 | 7/2015 | Tsai et al. | |
| 9,231,097 B2 | 1/2016 | Lee | |
| 11,018,171 B2 | 5/2021 | Sawada et al. | |
| 2015/0263173 A1 | 9/2015 | Lue | |
| 2017/0200811 A1* | 7/2017 | Lu | H01L 23/535 |

(Continued)

FOREIGN PATENT DOCUMENTS

KR    10-2021-0014829 A    2/2021

OTHER PUBLICATIONS

Office Action dated Nov. 10, 2025 issued in corresponding to Korean Patent Application No. 10-2021-0151325.

*Primary Examiner* — Christine A Enad
(74) *Attorney, Agent, or Firm* — Morgan, Lewis & Bockius LLP

(57) ABSTRACT

A semiconductor device includes an active fin protruding from a substrate, extending in a first direction, and defined by a device isolation layer. Gate structures intersect the active fin and extend in a second direction. Each of the gate structures includes a gate and gate spacers on side surfaces of the gate. Epitaxial layers are disposed on the active fin, on opposite sides of the gate structure, and include a first epitaxial layer providing a drain region and a second epitaxial layer providing a source region. The gate spacers include a first spacer disposed between the first epitaxial layer and the gate. The first spacer includes a first region extending in a third direction, along a side surface of the gate, and a second region extending from a lower portion of the first region in a direction away from the gate.

18 Claims, 28 Drawing Sheets

(56)          References Cited

U.S. PATENT DOCUMENTS

| | | | |
|---|---|---|---|
| 2020/0321466 A1* | 10/2020 | Cortes ................ | H10D 30/0323 |
| 2021/0098627 A1* | 4/2021 | Liaw .................. | H10D 30/0243 |
| 2022/0271031 A1* | 8/2022 | Teng ................... | H10D 84/834 |
| 2022/0352189 A1* | 11/2022 | Shimizu ............... | H10D 30/683 |
| 2023/0062842 A1* | 3/2023 | Huang ................... | H10B 61/22 |

* cited by examiner

A

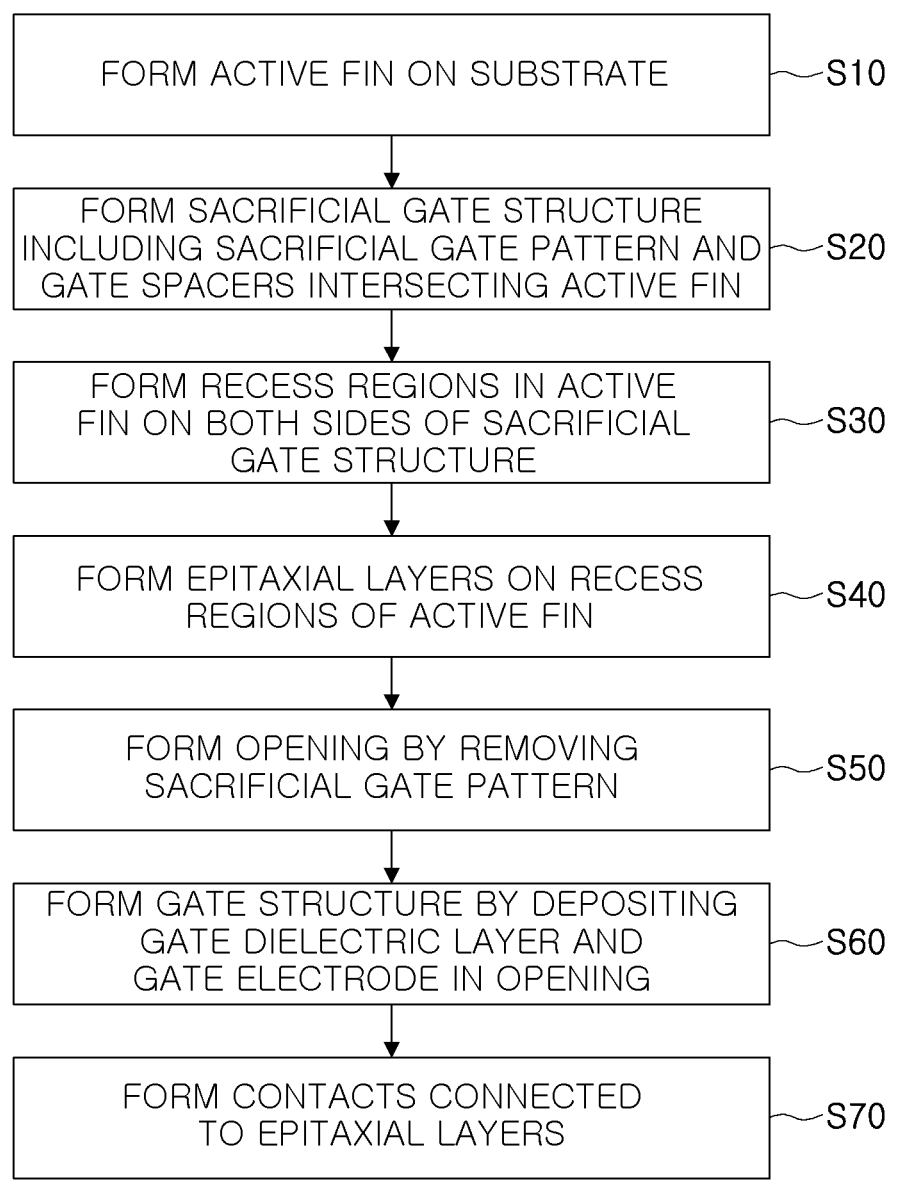

FORM ACTIVE FIN ON SUBSTRATE — S10

FORM SACRIFICIAL GATE STRUCTURE INCLUDING SACRIFICIAL GATE PATTERN AND GATE SPACERS INTERSECTING ACTIVE FIN — S20

FORM RECESS REGIONS IN ACTIVE FIN ON BOTH SIDES OF SACRIFICIAL GATE STRUCTURE — S30

FORM EPITAXIAL LAYERS ON RECESS REGIONS OF ACTIVE FIN — S40

FORM OPENING BY REMOVING SACRIFICIAL GATE PATTERN — S50

FORM GATE STRUCTURE BY DEPOSITING GATE DIELECTRIC LAYER AND GATE ELECTRODE IN OPENING — S60

FORM CONTACTS CONNECTED TO EPITAXIAL LAYERS — S70

FIG. 9A

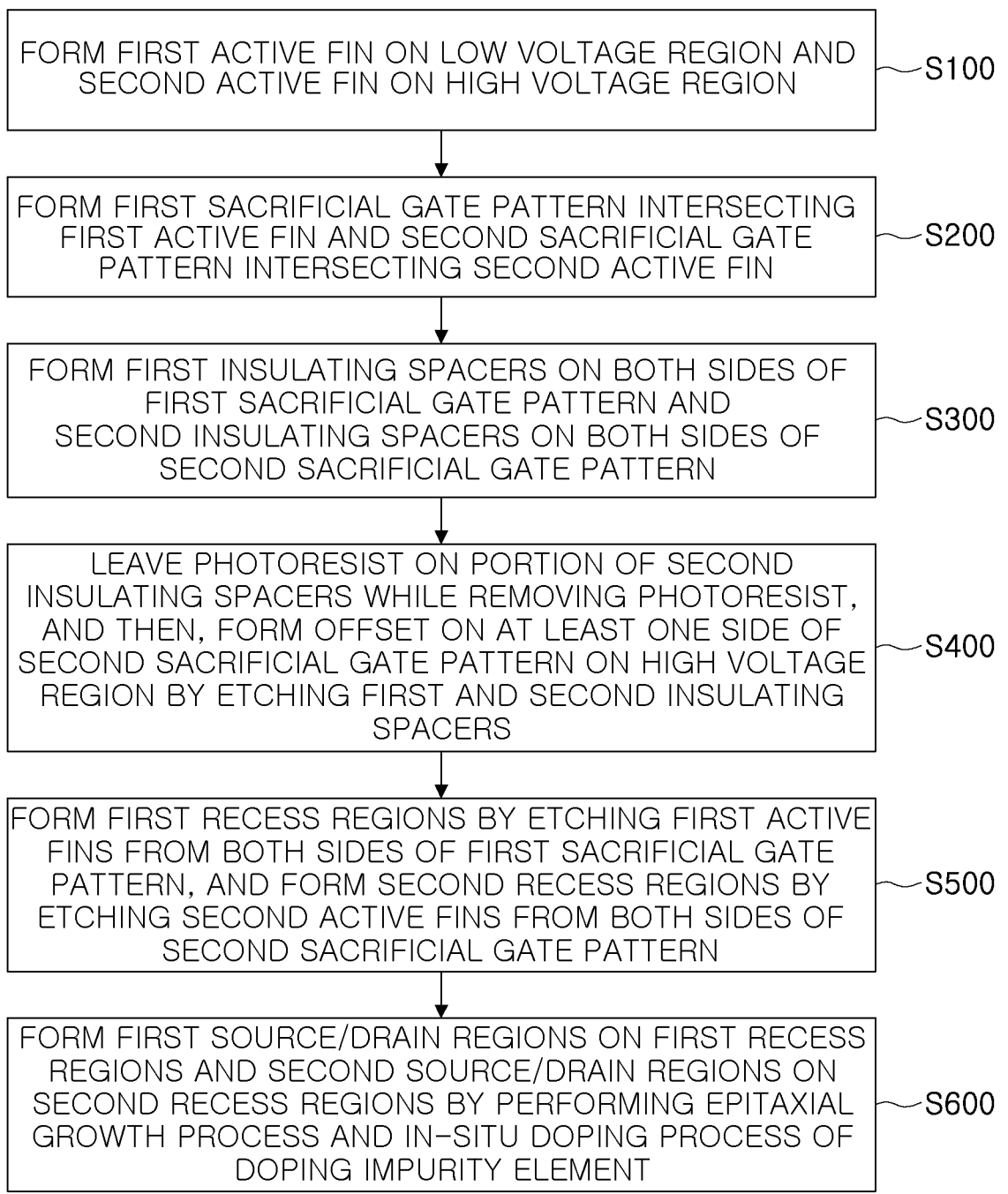

FORM FIRST ACTIVE FIN ON LOW VOLTAGE REGION AND
SECOND ACTIVE FIN ON HIGH VOLTAGE REGION     ~S100

FORM FIRST SACRIFICIAL GATE PATTERN INTERSECTING
FIRST ACTIVE FIN AND SECOND SACRIFICIAL GATE
PATTERN INTERSECTING SECOND ACTIVE FIN     ~S200

FORM FIRST INSULATING SPACERS ON BOTH SIDES OF
FIRST SACRIFICIAL GATE PATTERN AND
SECOND INSULATING SPACERS ON BOTH SIDES OF
SECOND SACRIFICIAL GATE PATTERN     ~S300

LEAVE PHOTORESIST ON PORTION OF SECOND
INSULATING SPACERS WHILE REMOVING PHOTORESIST,
AND THEN, FORM OFFSET ON AT LEAST ONE SIDE OF
SECOND SACRIFICIAL GATE PATTERN ON HIGH VOLTAGE
REGION BY ETCHING FIRST AND SECOND INSULATING
SPACERS     ~S400

FORM FIRST RECESS REGIONS BY ETCHING FIRST ACTIVE
FINS FROM BOTH SIDES OF FIRST SACRIFICIAL GATE
PATTERN, AND FORM SECOND RECESS REGIONS BY
ETCHING SECOND ACTIVE FINS FROM BOTH SIDES OF
SECOND SACRIFICIAL GATE PATTERN     ~S500

FORM FIRST SOURCE/DRAIN REGIONS ON FIRST RECESS
REGIONS AND SECOND SOURCE/DRAIN REGIONS ON
SECOND RECESS REGIONS BY PERFORMING EPITAXIAL
GROWTH PROCESS AND IN-SITU DOPING PROCESS OF
DOPING IMPURITY ELEMENT     ~S600

SEMICONDUCTOR DEVICE AND METHOD OF MANUFACTURING THE SEMICONDUCTOR DEVICE

CROSS-REFERENCE TO RELATED APPLICATION(S)

This application claims priority under 35 USC 119(a) to Korean Patent Application No. 10-2021-0151325 filed on Nov. 5, 2021 in the Korean Intellectual Property Office, the disclosure of which is incorporated by reference herein in its entirety.

TECHNICAL FIELD

The present inventive concept relates to a semiconductor device and a method of manufacturing the semiconductor device.

DISCUSSION OF THE RELATED ART

Field effect transistors (FET) have been developed to be more highly integrated. For example, a FinFET having a three-dimensional structure has been developed.

The FinFET device has a structure capable of reducing the short channel effect that may be experienced in other FETs. The FinFET device includes an active region having a fin shape. Since the channel region is formed in the fin-shaped active region, the FinFET device may have a suitable channel having its width bound within a relatively small horizontal region, as compared to the related art planar transistor. Therefore, the FinFET device may be scalable and capable of achieving a high performance, as compared to the related art planar transistor of a similar size, and thus, FinFET devices have been applied to various low-power/ high-performance applications.

SUMMARY

A semiconductor device includes an active fin protruding from a substrate and extending in a first direction. A device isolation layer defines the active fin in the substrate and covers a portion of a side surface of the active fin. A plurality of gate structures intersect the active fin and extend in a second direction, perpendicular to the first direction. Each of the plurality of gate structures includes a gate and gate spacers on side surfaces of the gate. A plurality of epitaxial layers is disposed on the active fin, on opposite sides of the gate structure and includes a first epitaxial layer providing a drain region and a second epitaxial layer providing a source region. The gate spacers include a first spacer disposed between the first epitaxial layer and the gate. The first spacer includes a first region extending in a third direction, perpendicular to an upper surface of the substrate, along a side surface of the gate, and a second region extending from a lower portion of the first region in a direction away from the gate.

A semiconductor device includes an active fin protruding from a substrate and extending in a first direction. A device isolation layer defines the active fin in the substrate and covers a portion of a side surface of the active fin. A plurality of gate structures intersect the active fin and extend in a second direction, perpendicular to the first direction. A first epitaxial layer is disposed on a first recess region of the active fin, outside of a first gate structure, among the plurality of gate structures. A second epitaxial layer is disposed on a second recess region of the active fin, outside of a second gate structure, among the plurality of gate structures. One or more third epitaxial layers are disposed on one or more third recess regions on the active fin, between the first gate structure and the second gate structure. Each of the plurality of gate structures includes a gate and gate spacers on side surfaces of the gate. Among the gate spacers, a first gate spacer in contact with the first epitaxial layer includes a first region extending in a third direction, perpendicular to an upper surface of the substrate, and a second region bent from a lower portion of the first region and extending toward the first epitaxial layer. A length of the first epitaxial layer in the first direction is shorter than a length of the one or the plurality of third epitaxial layers in the first direction.

A semiconductor device includes an active fin protruding from a substrate and extending in a first direction. A device isolation layer defines the active fin in the substrate and covers a portion of a side surface of the active fin. A first gate structure intersects the active fin and extends in a second direction, perpendicular to the first direction. A first dummy gate structure extends in the second direction and is adjacent to the first gate structure. A first epitaxial layer is disposed on a first recess region of the active fin, between the first gate structure and the first dummy gate structure. The first gate structure includes a first gate, and a first gate spacer disposed on one side surface adjacent to the first dummy gate structure, among side surfaces of the first gate. The first gate spacer includes a first region extending in a third direction, perpendicular to an upper surface of the substrate, and a second region extending from a lower portion of the first region toward the first dummy gate structure. The first epitaxial layer is disposed between the dummy gate structure and the second region.

A method of manufacturing a semiconductor device includes forming an active fin on a substrate. A sacrificial gate structure including a sacrificial gate pattern and gate spacers, intersecting the active fin, is formed. Recess regions are formed in the active fin, on opposite sides of the sacrificial gate structure. Epitaxial layers are formed on the recess regions of the active fin. An opening is formed by removing the sacrificial gate pattern. A gate structure is formed by depositing a gate dielectric layer and a gate electrode in the opening. Contacts connected to the epitaxial layers are formed. The forming of the sacrificial gate structure includes forming the sacrificial gate pattern on the active fin, forming an insulating spacer on the sacrificial gate pattern on the active fin, forming a photoresist on the insulating spacer, removing the photoresist, while leaving a region in which an offset is to be formed in the insulating spacer, and etching the insulating spacer to form the gate spacers.

A method of manufacturing a semiconductor device includes forming a first active fin on a low voltage region and a second active fin on a high voltage region. A first sacrificial gate pattern intersecting the first active fin is formed. A second sacrificial gate pattern intersecting the second active fin is formed. A first insulating spacer is formed on opposite sides of the first sacrificial gate pattern. A second insulating spacer is formed on opposite sides of the second sacrificial gate pattern. A photoresist is formed on the first and second insulating spacers. After leaving the photoresist on a portion of the second insulating spacer, the first and second insulating spacers are etched and the second insulating spacer is formed as a gate spacer having an offset region on at least one side of the second sacrificial gate pattern in the high voltage region. First recess regions are formed by etching the first active fin from opposite sides of the first sacrificial gate pattern and second recess regions by etching the second active fin from opposite sides of the second sacrificial gate pattern. First epitaxial layers are formed on the first recess regions and second epitaxial layers are formed on the second recess regions by performing an epitaxial growth process and an in-situ doping process of doping an impurity element.

BRIEF DESCRIPTION OF DRAWINGS

The above and other aspects and features of the present inventive concept will be more clearly understood from the following detailed description, taken in conjunction with the accompanying drawings, in which:

FIGS. 9A and 9B are flowcharts illustrating a method of manufacturing a semiconductor device according to a process sequence according to example embodiments;

FIG. 19 is a flowchart illustrating a process sequence to illustrate a method of manufacturing a semiconductor device according to example embodiments.

DETAILED DESCRIPTION

Hereinafter, example embodiments will be described with reference to the accompanying drawings.

Figure 1:
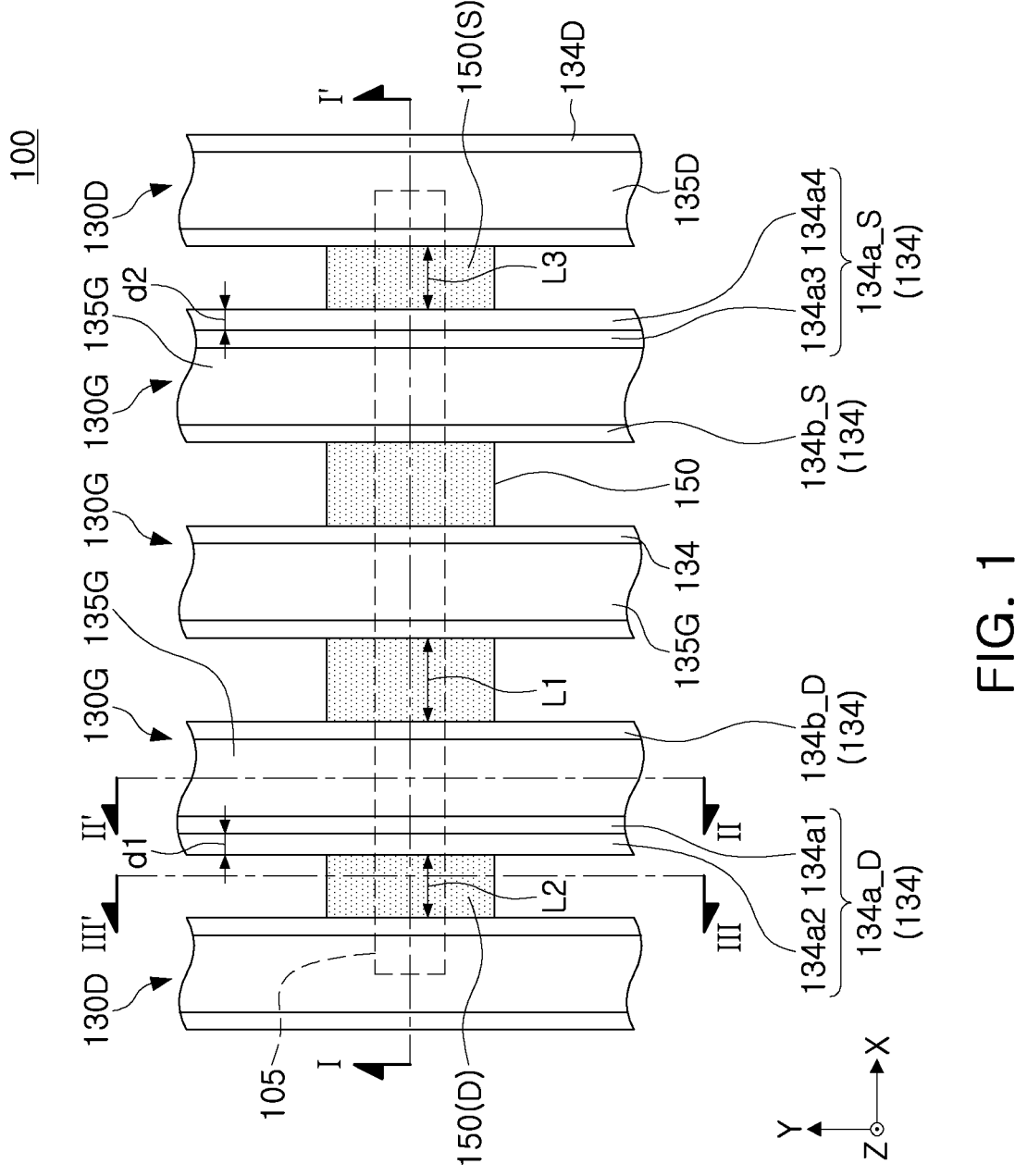
FIG. 1 is a schematic plan view of a semiconductor device according to example embodiments.

FIG. 1 is a schematic plan view of a semiconductor device according to example embodiments.

Figure 2A:
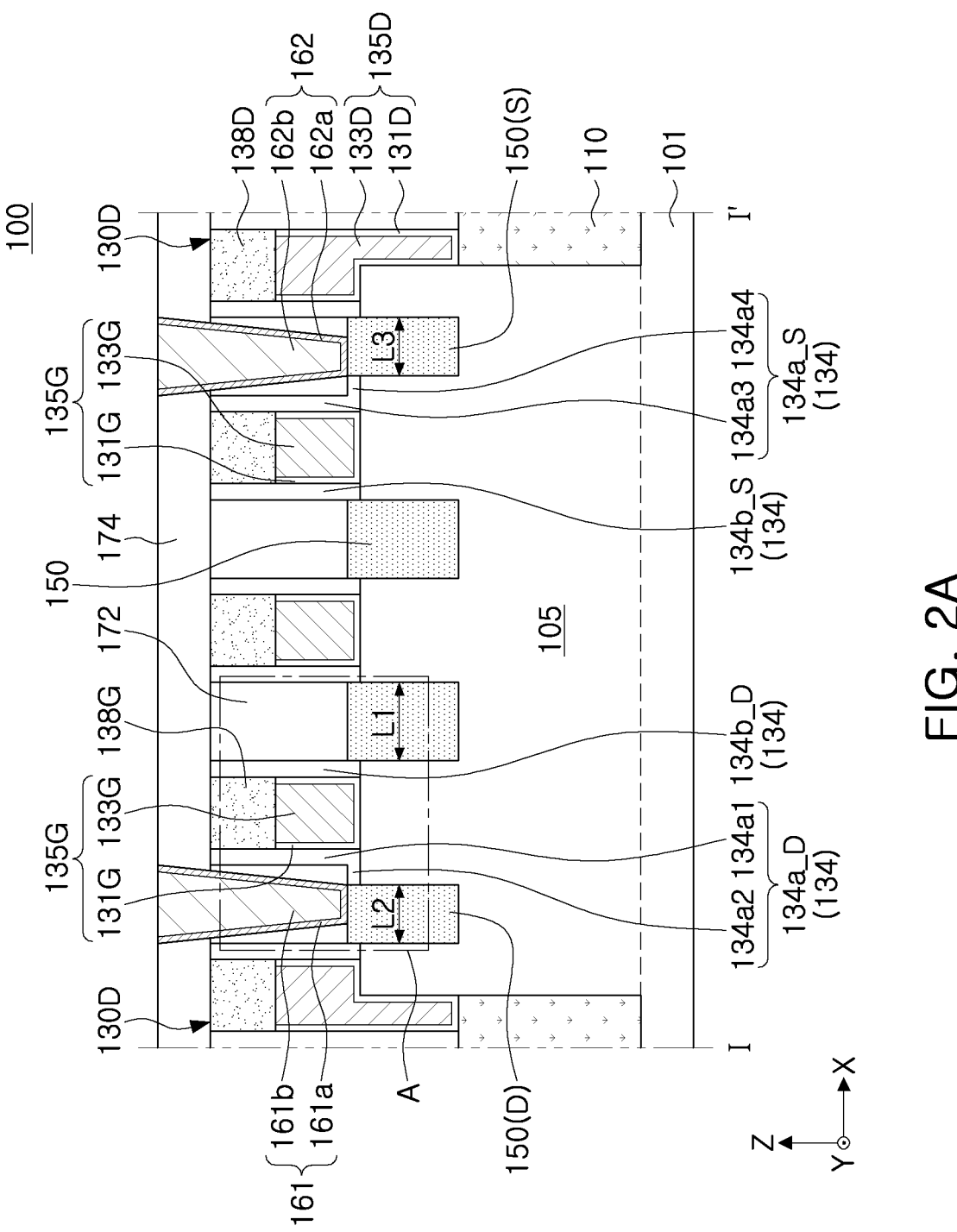
FIG. 2A is a schematic cross-sectional view of a semiconductor device according to example embodiments.
Figure 2B:
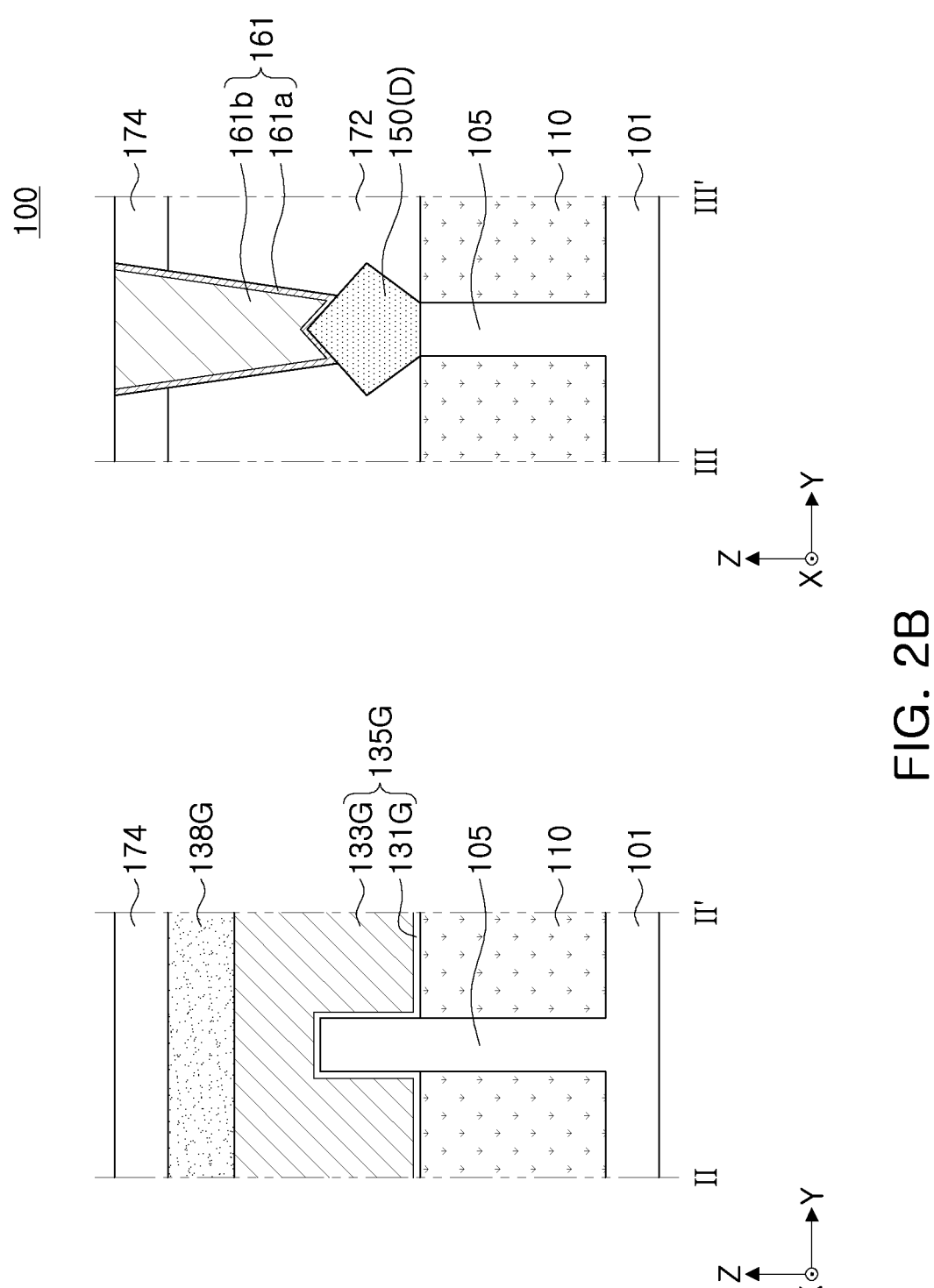
FIG. 2B is a schematic cross-sectional view of a semiconductor device according to example embodiments.

FIGS. 2A and 2B are schematic cross-sectional views of a semiconductor device according to example embodiments. FIG. 2A illustrates a cross section of the semiconductor device of FIG. 1 taken along line I-I', and FIG. 2B illustrates cross sections of the semiconductor device of FIG. 1 taken along lines II-II' and III-III'.

Figure 3:
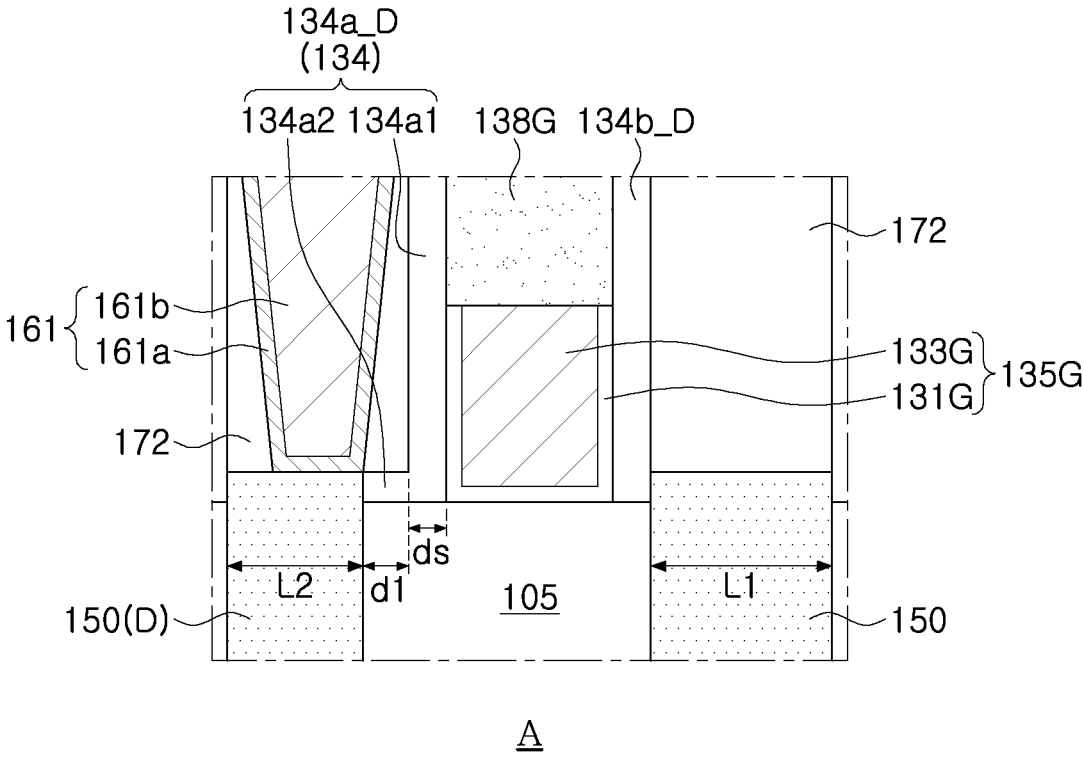
FIG. 3 is a partially enlarged view of a semiconductor device according to example embodiments.

FIG. 3 is a partially enlarged view of a semiconductor device according to example embodiments. FIG. 3 illustrates an enlarged view of area 'A' of FIG. 2A.

Referring to FIGS. 1 to 3, a semiconductor device 100 may include a substrate 101, an active fin 105 extending in the first direction X on the substrate 101, gate structures 130G extending in the second direction Y to intersect the active fin 105, and epitaxial layers 150 disposed on the active fin 105, on opposite sides of the gate structures 130G. The semiconductor device 100 may further include a device isolation layer 110 defining the active fin 105 in the substrate 101, dummy gate structures 130D disposed side by side with the gate structures 130G, contacts 161 and 162 connected to at least some of the epitaxial layers 150, and interlayer insulating layers 172 and 174.

The semiconductor device 100 may include FinFET devices which are transistors in which the active fin 105 has a fin-shaped structure. The FinFET devices may include transistors disposed around the active fin 105 and the gate structure 130G that intersect each other. For example, the semiconductor device 100 may include NMOS transistors and/or PMOS transistors.

The substrate 101 may include a semiconductor material, for example, a group IV semiconductor, a group III-V compound semiconductor, or a group II-VI compound semiconductor. For example, the group IV semiconductor may include silicon (Si) and/or germanium (Ge), for example, silicon-germanium (SiGe). The substrate 101 may be provided as a bulk wafer, an epitaxial layer, a silicon on insulator (SOI) layer, a semiconductor on insulator (SeOI) layer, or the like.

The device isolation layer 110 may define the active fin 105 on the substrate 101. The device isolation layer 110 may be formed by, for example, a shallow trench isolation (STI) process. In some embodiments, the device isolation layer 110 may also include a region extending deeper into a lower portion of the substrate 101 than in comparative arrangements. The device isolation layer 110 may have a curved upper surface having a higher level as it approaches the active fin 105, but the shape of the upper surface of the device isolation layer 110 is not necessarily limited thereto. The device isolation layer 110 may include an insulating material, for example, silicon oxide, silicon nitride, silicon oxynitride, and/or silicon oxycarbide.

The active fins 105 are defined by the device isolation layer 110 in the substrate 101 and may extend in a first direction (e.g., the X-direction). The active fin 105 may have a structure protruding from the substrate 101. The upper end of the active fin 105 may protrude to a predetermined height from the upper surface of the device isolation layer 110. The active fin 105 may be formed as a portion of the substrate 101 or may include an epitaxial layer grown from the substrate 101. However, on opposite sides of the gate structure 130G, the active fin 105 on the substrate 101 may be partially recessed, and epitaxial layers 150 may be disposed on the recessed active fin 105. In some embodiments, the active fins 105 may be disposed in plurality and the active fins of the plurality of active fins 105 may be spaced apart from each other in the second direction (e.g., Y direction).

The gate structure 130G may intersect the active fin 105 and may extend in the second direction Y. A channel region of a transistor may be formed in the active fin 105 intersecting the gate structure 130G. The gate structure 130G may include a gate 135G, gate spacers 134 on opposite sides of the gate 135G, and a gate capping layer 138G on the gate 135G. The gate 135G may include a gate dielectric layer 131G disposed on the active fin 105 and a gate electrode 133G disposed on the gate dielectric layer 131G.

The gate dielectric layer 131G may be disposed between the active fin 105 and the gate electrode 133G. The gate dielectric layer 131G may cover at least a portion of the surfaces of the gate electrode 133G, and for example, the gate dielectric layer 131G may surround all surfaces except for an uppermost surface of the gate electrode 133G. The gate dielectric layer 131G may include silicon oxide, silicon nitride, or a high-k material. The high-k material may refer to a dielectric material having a higher dielectric constant than silicon oxide. The high-k material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$). In an illustrative embodiment, the thickness of the gate dielectric layer 131G may range from about 1.5 nm to about 10 nm, and the semiconductor device 100 may include a transistor having a relatively thick oxide layer.

The gate electrode 133G may be spaced apart from the active fin 105 with the gate dielectric layer 131G interposed therebetween. The gate electrode 133G may include a plurality of metal layers. The gate electrode 133G may include a conductive material, for example, W, Ti, Ta, Mo, TiN, TaN, WN, TiON, TiAlC, TiAlN, and/or TaAlC. The gate electrode 133G may include a semiconductor material such as doped polysilicon.

The gate spacers 134 may be disposed on opposite sides of the gate 135G. The gate spacers 134 may include portions having a curved outer surface such that the width of the upper portion is smaller than the width of the lower portion, but the configuration is not necessarily limited thereto. The gate spacers 134 may electrically insulate the epitaxial layers 150 from the gate 135G. Each of the gate spacers 134 may have a multilayer structure. The gate spacers 134 may include an insulating material, for example, silicon oxide, silicon nitride, silicon oxynitride, and/or silicon oxycarbide.

The gate spacers 134 may include drain spacers 134a_D and 134b_D and source spacers 134a_S and 134b_S. The drain spacers 134a_D and 134b_D may be disposed on opposite sides of one first gate 135G and may be provided as a pair, and the source spacers 134a_S and 134b_S may be disposed on opposite sides of one second gate 135G and may be provided as a pair. The pair of drain spacers 134a_D and 134b_D may form an asymmetrical structure, and the pair of source spacers 134a_S and 134b_S may also form an asymmetrical structure, but the present inventive concept is not necessarily limited thereto.

The pair of drain spacers 134a_D and 134b_D may include a first spacer 134a_D and a second spacer 134b_D disposed on opposite sides of the first gate 135G, and the first spacer 134a_D may have a shape different from that of the second spacer 134b_D. The first spacer 134a_D may be disposed between a first epitaxial layer 150(D) serving as the drain region 150(D) and the first gate 135G. The second spacer 134b_D may be disposed on a second side opposite to a first side of the first gate 135G in contact with the first spacer 134a_D. The first spacer 134a_D may include a first region 134a1 extending in a third direction Z perpendicular to the upper surface of the substrate 101 along a side surface of the first gate 135G, and a second region 134a2 extending from a lower portion of the first region 134a1 in a direction away from the first gate 135G. The first spacer 134a_D may include a bent portion between the first region 134a1 and the second region 134a2. The second region 134a2 may extend toward the first epitaxial layer 150(D). The second region 134a2 may be disposed at a lower level (relative to the substrate 101 which may be considered the lowest level) than the first region 134a1. A length d1 of the second region 134a2 in the first direction X may range from about 1 nm to about 50 nm, for example, from about 25 nm to about 35 nm. The first region 134a1 may have a predetermined thickness ds in the first direction X, and the thickness ds may be substantially equal to or similar to the length d1 of the second region 134a2.

The pair of source spacers 134a_S and 134b_S may include a third spacer 134a_S and a fourth spacer 134b_S disposed on opposite sides of the second gate 135G. The pair of drain spacers 134a_D and 134b_D may have mirror symmetry with the pair of source spacers 134a_S and 134b_S. Accordingly, the pair of source spacers 134a_S and 134b_S may have a structure similar to that of the pair of drain spacers 134a_D and 134b_D. For example, the third spacer 134a_S may have a shape different from that of the fourth spacer 134b_S. The third spacer 134a_S may include a third region 134a3 extending in the third direction Z along a side surface of the second gate 135G, and a fourth region 134a4 extending from a lower portion of the third region 134a3 in a direction away from the second gate 135G. The third spacer 134a_D may be disposed between a second epitaxial layer 150(S) serving as the source region 150(S) and the second gate 135G.

Commercially available FinFET devices may have a relatively low operating voltage of 0.7V to 1V. Analog devices such as Input/Output (I/O) devices are driven by a high voltage such as 3.3V. In the case in which the high voltage as described above is applied to the FinFET device, deterioration of hot carrier properties due to a high electric field in the drain region, and an increase in leakage current such as Gate Induced Drain Leakage (GIDL) may be caused.

Gate Induced Drain Leakage (GIDL) may occur when a voltage difference between the gate and drain regions of the FET in the off state is relatively large. When the channel length is reduced, a maximum electric field applied to the carriers in the drain region overlapping the gate increases, and as carriers move from the source region to the drain region, a kinetic energy large enough to cause impact ionization in the high electric field region of the drain junction is obtained. Some of these carriers may cross the barrier of the Si—$SiO_2$ interface and enter the oxide film. Carriers with energy greater than this high thermal energy might no longer be in thermal equilibrium with the lattice, and such carriers are referred to as hot carriers, and such hot carriers and GIDL are closely related to the magnitude of the maximum E-field.

In the case of the FinFET structure of the related art, since the distance between the drain region and the source region is relatively short, the magnitude of the electric field (E-field) applied between the source region and the drain region may increase, and as the electric field in the horizontal direction increases, tunneling occurs in which electrons pass to the other band, and thus, there may be a problem with hot carrier and GIDL occurring.

According to an example embodiment of the present inventive concept, in a FinFET device to which a relatively high voltage is applied, by providing an offset between the drain region 150(D) and the gate 135G, for example, the second region 134a2 of the first spacer 134a, the drain region 150(D) and the gate 135G may be further spaced apart from each other by an offset distance d1. Therefore, the overlap region in which the drain region 150(D) and the gate 135G overlap may be reduced, and a maximum electric field of the channel may be reduced. In detail, GIDL and hot carrier generation by the maximum electric field in a transistor to which a high voltage is applied is higher than the generation by the maximum electric field in the transistor to which the low voltage is applied, and thus, the magnitude of the maximum electric field in a transistor to which a high voltage is applied is reduced. Since the maximum electric field of the channel in the transistor to which a high voltage is applied may be reduced, the tunneling probability may be reduced, and thus, GIDL current and hot carrier generation may be reduced or significantly decreased. Accordingly, in a semiconductor device in which an analog device such as an Input/Output (I/O) device to which a relatively high voltage is applied is implemented as a FinFET device, the transistor may more effectively be turned-off and reliability of the transistor may be increased.

The gate capping layer 138G may be disposed on the gate 135G, and a lower surface and side surfaces thereof may be surrounded by the gate 135G and the gate spacers 134, respectively. The gate capping layer 138G may include, for example, silicon nitride, and/or silicon oxynitride. In an example embodiment, the gate capping layer 138G may fill a region in which the gate 135G and the gate spacers 134 have been partially removed from the upper portion.

The dummy gate structures 130D may cover an end of the active fin 105 in the first direction X and may be disposed in parallel with the gate structures 130G. The dummy gate structures 130D may include a dummy gate 135D including a dummy gate dielectric layer 131D and a dummy gate electrode 133D, a dummy gate capping layer 138D on the dummy gate 135D, and gate spacers 134. Components constituting the dummy gate structures 130D may be at least similar to components constituting the gate structures 130G.

The epitaxial layers 150 may be disposed on opposite sides of the channel region of the active fin 105 intersecting the gate structure 130G. The epitaxial layers 150 may be disposed by partially recessing the upper portion of the active fin 105 on opposite sides of the gate structure 130G. However, in example embodiments, the presence or absence of the recess and the depth of the recess may be variously changed. The epitaxial layers 150 may serve as a source region or a drain region of the transistors. The epitaxial layers 150 may have a mutually connected and merged shape on a plurality of active fins 105 adjacent in the second direction Y, but the configuration is not necessarily limited thereto. The epitaxial layers 150 may have angled side surfaces in a cross-section in the second direction Y. However, in example embodiments, the epitaxial layers 150 may have various shapes, for example, polygonal, circular, oval, and/or rectangular shapes.

The epitaxial layers 150 may include silicon (Si), for example, silicon germanium (SiGe), or silicon carbide (SiC). The epitaxial layers 150 may be formed of a plurality of layers including different concentrations of elements and/or doping elements. The epitaxial layers 150 may include silicon (Si) doped with a pentavalent N-type impurity element including phosphorus (P), arsenic (As), bismuth (Bi), and/or antimony (Sb). The epitaxial layers 150 may also include silicon germanium (SiGe) doped with a trivalent P-type impurity element including boron (B), indium (In), and/or gallium (Ga).

For example, to provide a channel region having a relatively longer channel length, the semiconductor device 100 may include a transistor in which the first epitaxial layer 150(D) is a drain region and the second epitaxial layer 150(S) is a source region. The epitaxial layers 150 may include a first epitaxial layer 150(D) disposed on the first recess region of the active fin 105 outside the first gate structure 130G, a second epitaxial layer 150(S) disposed on the second recess region of the active fin 105 outside the second gate structure 130G, and one or a plurality of third epitaxial layers 150 disposed on one or a plurality of third recess regions of the active fin 105, between the first and second gate structures 130G. The first epitaxial layer 150(D)

may be in contact with the first spacer 134a_D, and may be disposed between the first dummy gate structure 130D, adjacent to the first gate structure 130G, and the first gate structure 130G. The second epitaxial layer 150(S) may be in contact with the third spacer 134a_S, and may be disposed between the second dummy gate structure 130D adjacent to the second gate structure 130G and the second gate structure 130G.

The pitch of the gate pattern structures including the gate structures 130G and the dummy gate structures 130D in the first direction X may be constant. The gate pattern structures have a constant pitch, but include a region in which a portion 134a_D or 134a_S of the gate spacers 134 is offset, and thus, a portion 150(D) or 150(S) of the epitaxial layers 150 may have a smaller length in the first direction X than other epitaxial layers 150. For example, at least one of the one or the plurality of third epitaxial layers 150 between the gate structures 130G may have a first length L1 in a first direction X, and the first epitaxial layer 150(D) may have a second length L2 that is shorter than the first length L1 in the first direction X. The second epitaxial layer 150(S) may also have a third length L3 shorter than the first length L1 in the first direction X. The second length L2 and the third length L3 may be substantially the same as each other, but are not necessarily limited thereto. The first epitaxial layer 150(D) and the second epitaxial layer 150(S) may have a mirror-symmetric structure with respect to the center of one or the plurality of third epitaxial layers 150, but the present inventive concept is not necessarily limited thereto.

The contacts 161 and 162 may pass through the interlayer insulating layers 172 and 174 and an insulating liner to be connected to the epitaxial layers 150. The contacts 161 and 162 may apply an electrical signal to the epitaxial layers 150. Each of the contacts 161 and 162 may include barrier layers 161a and 162a and metal layers 161b and 162b. The barrier layers 161a and 162a may surround lower surfaces and side surfaces of the metal layers 161b and 162b. The barrier layers 161a and 162a may include a metal nitride, for example, titanium nitride (TiN), tantalum nitride (TaN), and/or tungsten nitride (WN). The metal layers 161b and 162b may include a metal material, for example, aluminum (Al), copper (Cu), tungsten (W), cobalt (Co), ruthenium (Ru), and/or molybdenum (Mo). According to an example embodiment, the barrier layers 161a and 162a may be omitted.

A metal-semiconductor compound layer may be further disposed between the contacts 161 and 162 and the epitaxial layers 150. The metal-semiconductor compound layer may include, for example, metal silicide, metal germanide, or metal silicide-germanide. In the metal-semiconductor compound layer, the metal may be titanium (Ti), nickel (Ni), tantalum (Ta), cobalt (Co), or tungsten (W), and the semiconductor is silicon (Si), germanium (Ge), or silicon germanium (SiGe). For example, the metal-semiconductor compound layer may include cobalt silicide (CoSi), titanium silicide (TiSi), nickel silicide (NiSi), and/or tungsten silicide (WSi).

The contacts 161 and 162 may include a first contact 161 connected to the first epitaxial layer 150(D) serving as the drain region 150(D), and a second contact 162 connected to the second epitaxial layer 150(S) serving as the source region 150(S). A driving voltage VDD in a range of about 1.2 V to about 50 V may be applied to the first contact 161. In an illustrative embodiment, a driving voltage VDD in the range of about 3.3 V or about 3.1 V to about 3.5 V may be applied to the first contact 161.

The interlayer insulating layers 172 and 174 may be disposed on the epitaxial layers 150 and the gate structure 130G. The interlayer insulating layers 172 and 174 may include a first interlayer insulating layer 172 and a second interlayer insulating layer 174 on the first interlayer insulating layer 172. The first interlayer insulating layer 172 may be disposed on side surfaces of the gate structures 130G, and the second interlayer insulating layer 174 may be disposed on the gate structures 130G and the dummy structures 130D. The first interlayer insulating layer 172 may also be disposed on the upper surface of the device isolation layer 110 not covered by the gate structure 130G. The interlayer insulating layers 172 and 174 may include, for example, silicon oxide, silicon nitride, silicon oxynitride, and/or silicon oxycarbide. The interlayer insulating layers 172 and 174 may also include a plurality of insulating layers.

An insulating liner may be further disposed below the interlayer insulating layers 172 and 174. The insulating liner covers the upper surface of the device isolation layer 110 that does not overlap the gate structure 130G, and may extend onto the epitaxial layers 150. An insulating liner may extend over the sides of the gate structure 130G. The insulating liner may include, for example, silicon oxide, silicon nitride, and/or silicon oxynitride.

Figure 4:
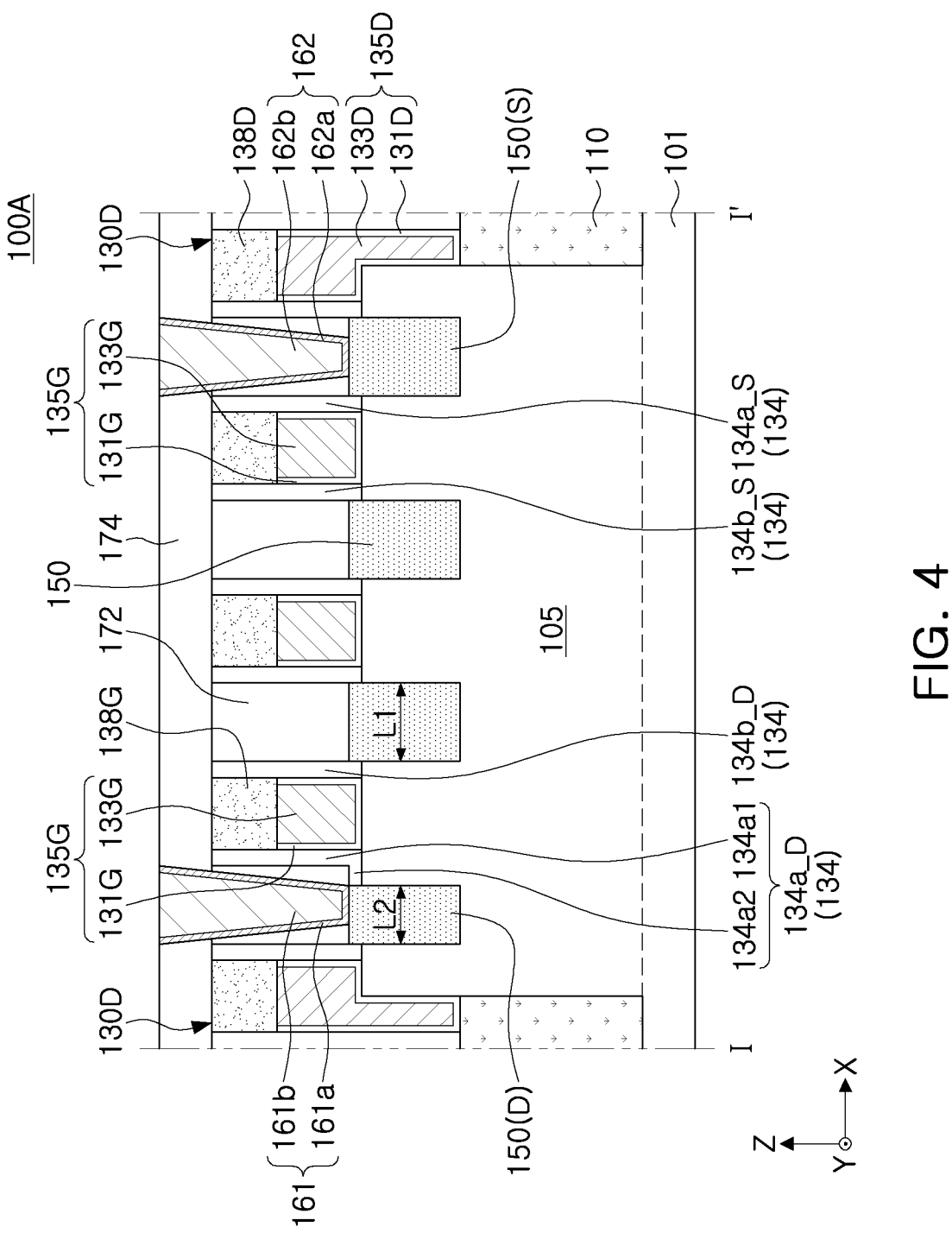
FIGS. 4 to 6 are schematic cross-sectional views of semiconductor devices according to example embodiments.
Figure 5:
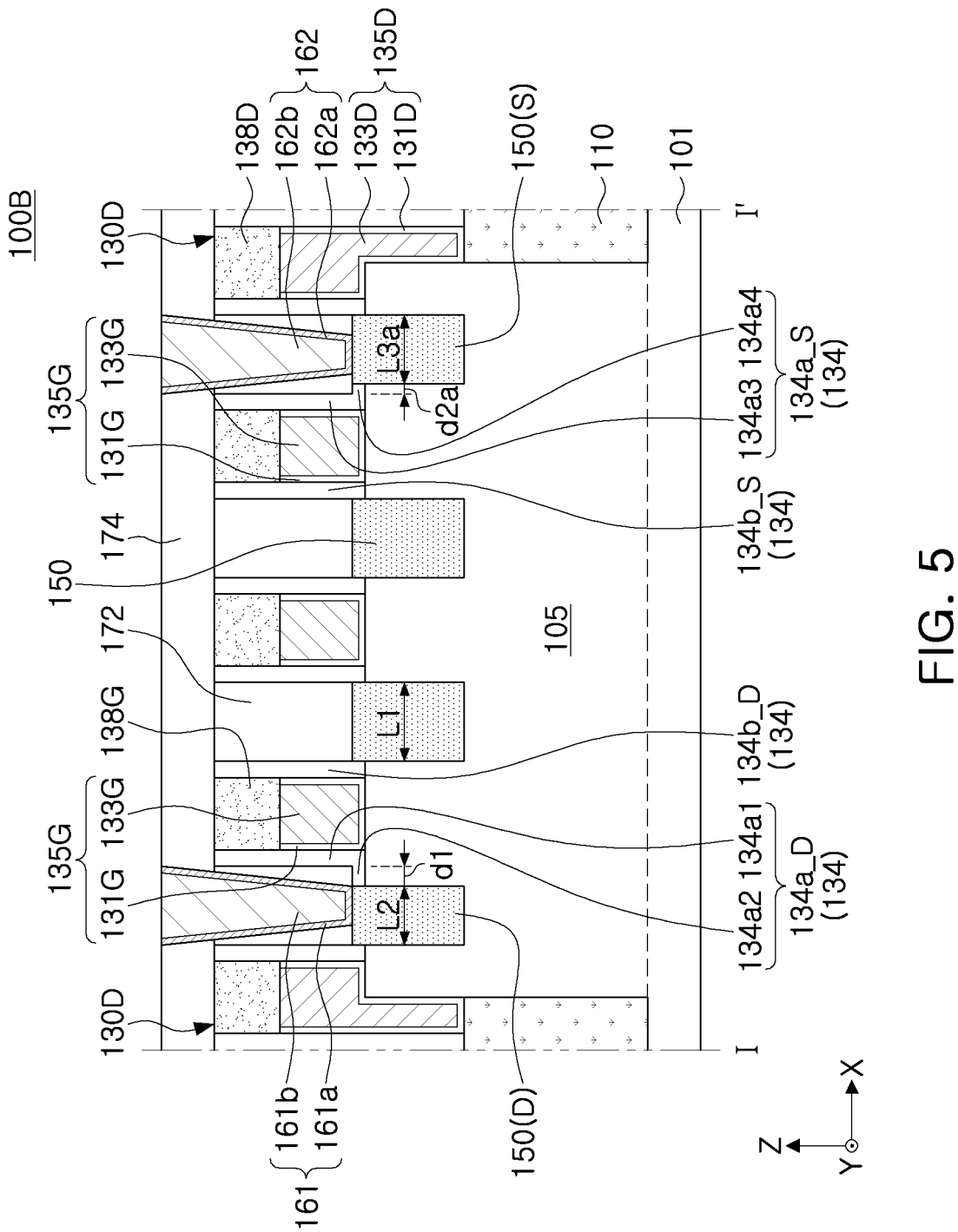
Figure 6:
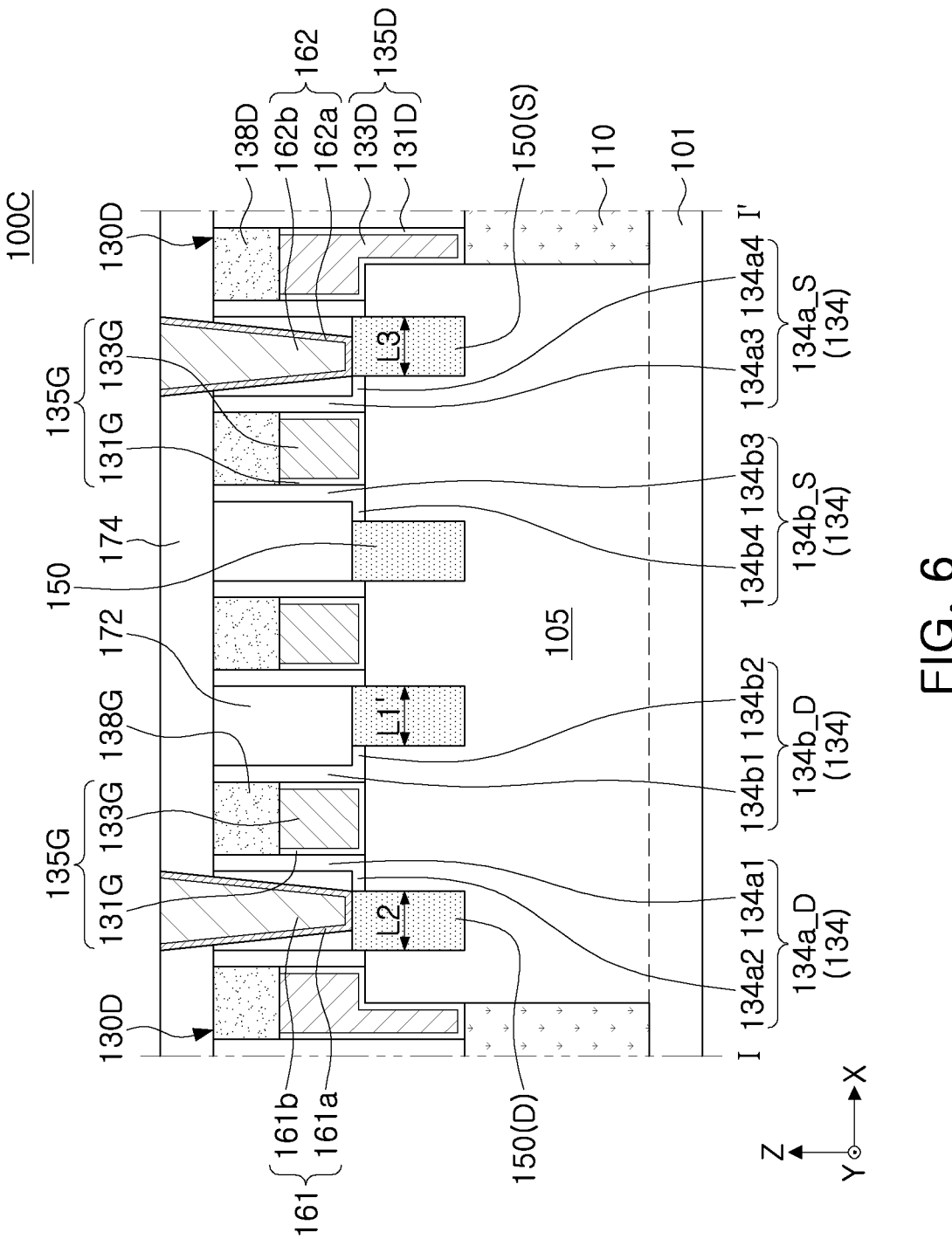

FIGS. 4 to 6 are schematic cross-sectional views of semiconductor devices according to example embodiments. FIGS. 4 to 6 illustrate regions corresponding to FIG. 2A. In the example embodiments of FIGS. 4 to 6, to the extent that a description of an element has been omitted, that element may be understood to be at least similar to a corresponding element of FIG. 2A.

Referring to FIG. 4, in a semiconductor device 100A, the first spacer 134a_D in contact with the first epitaxial layer 150(D) is offset to include a second region 134a2, and the third spacer 134a_S in contact with the second epitaxial layer 150(S) might not be offset. In this case, the drain spacers 134a_D and 134b_D form an asymmetrical structure with each other, and the drain spacers 134a_D and 134b_D may form a symmetric structure with the source spacers 134a_S and 134b_S.

Referring to FIG. 5, in a semiconductor device 100B, the offset distance of the first spacer 134a_D in contact with the first epitaxial layer 150(D) may be different from the offset distance of the third spacer 134a_S in contact with the second epitaxial layer 150(S). For example, an offset distance d1 of the second region 134a2 of the first spacer 134a_D in the first direction X may be greater than an offset distance d2a of the fourth region 134a4 of the third spacer 134a_S in the first direction X. Accordingly, a length L2 of the first epitaxial layer 150(D) in the first direction X may be shorter than a length L3a of the second epitaxial layer 150(S) in the first direction X.

Referring to FIG. 6, in a semiconductor device 100C, both the first spacer 134a_D and the second spacer 134b_D forming a pair on opposite sides of the first gate 135G are offset to have a bent lower shape, and both the third spacer 134a_S and the fourth spacer 134b_S forming a pair on opposite sides of the second gate 135G may be offset to have a bent lower shape. In this case, the epitaxial layers 150 disposed on opposite sides of each of the first and second gates 135G may have relatively reduced lengths L1' and L2 in the X direction.

Figure 7A:
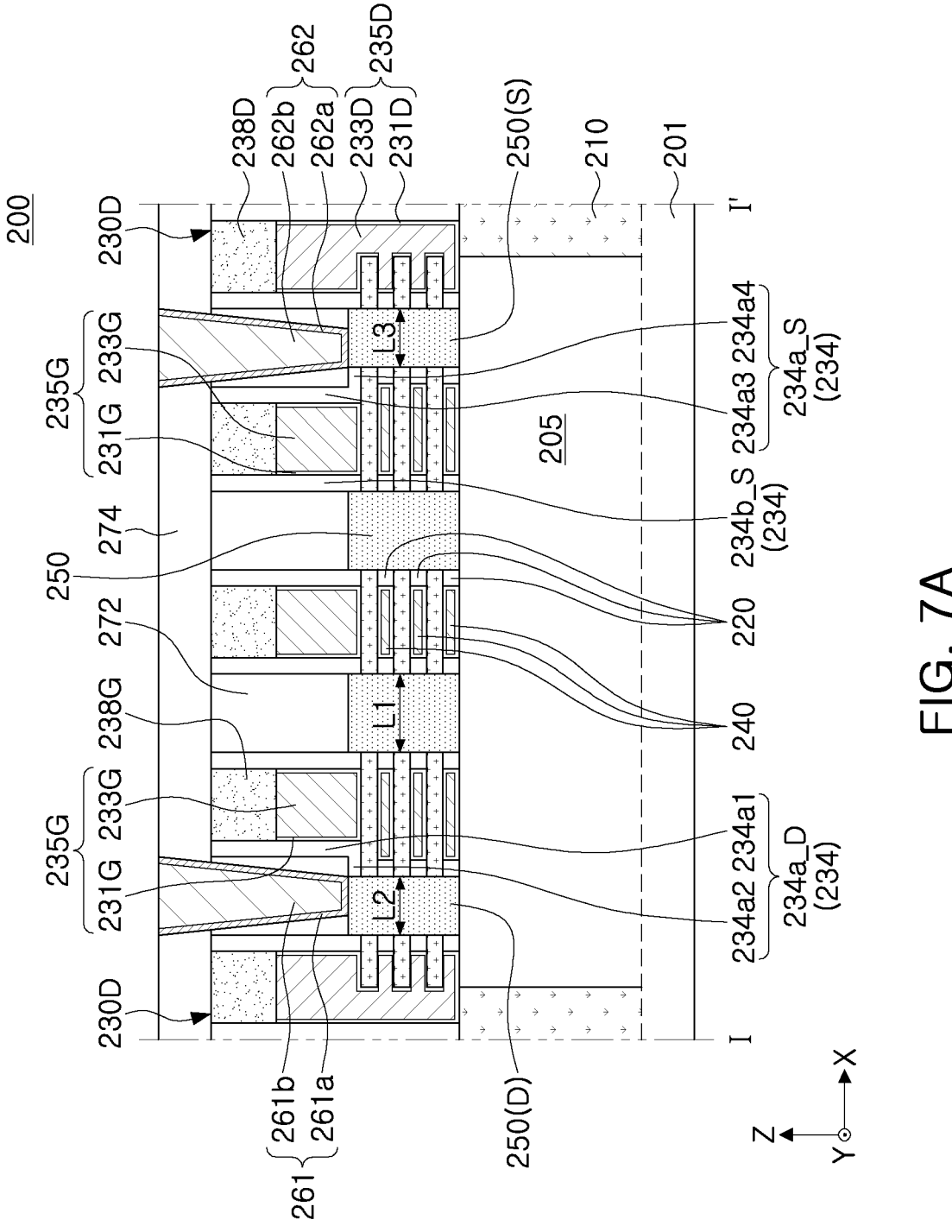
FIGS. 7A and 7B are schematic cross-sectional views of a semiconductor device according to example embodiments.
Figure 7B:
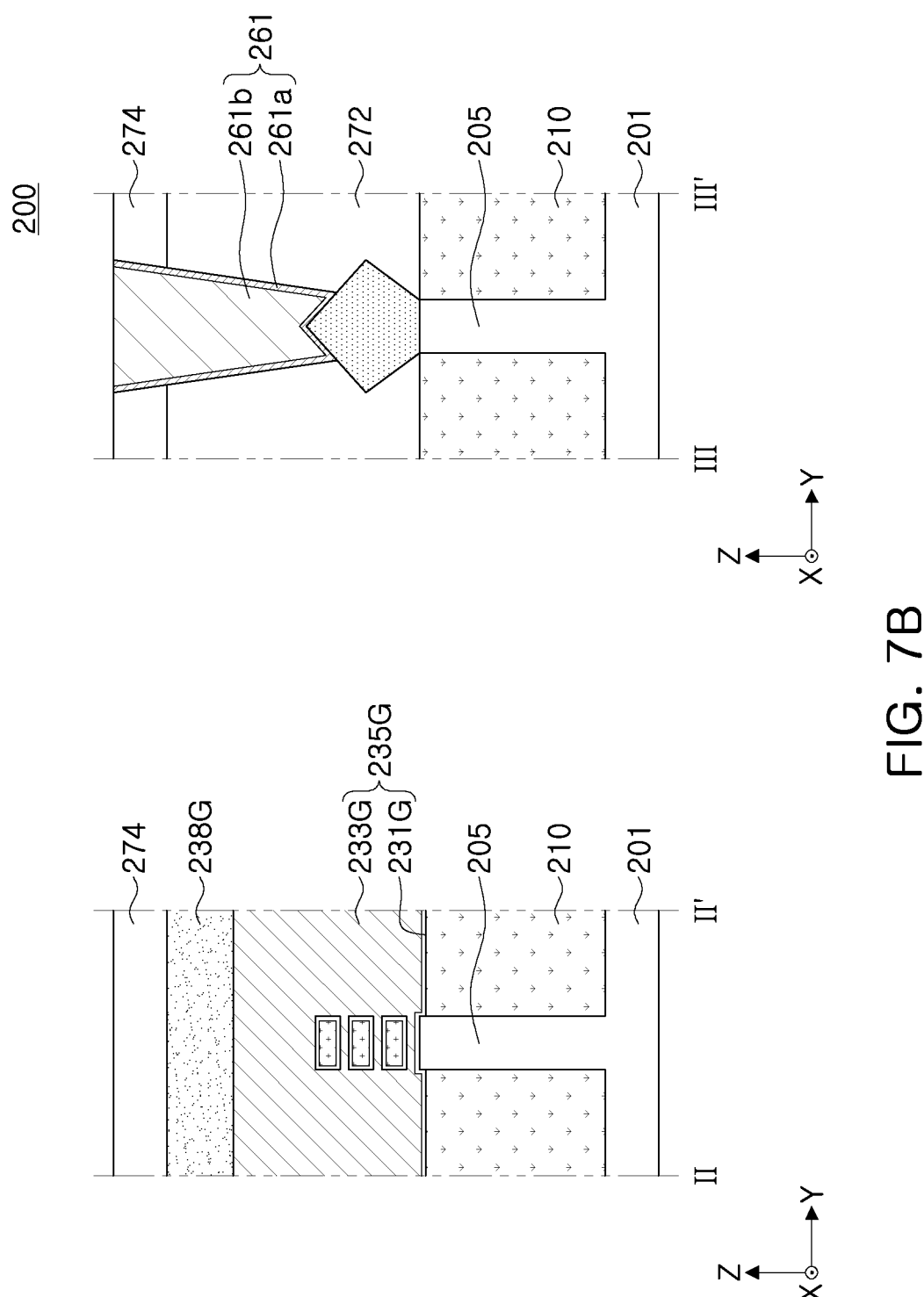

FIGS. 7A and 7B are schematic cross-sectional views of a semiconductor device according to example embodiments. FIG. 7A illustrates the region corresponding to FIG. 2A, and FIG. 7B illustrates the region corresponding to FIG. 2B.

Referring to FIGS. 7A and 7B, a semiconductor device 200 may further include a plurality of channel layers 240 disposed to be vertically spaced apart from each other on an active fin 205, and inner spacers 220 disposed in parallel with a gate 235G, between the plurality of channel layers 240. The semiconductor device 200 may include a gate-all-around type of transistors in which the gate 235G is disposed between the active fin 205 and the channel layers 240 and between the plurality of channel layers 240 having a nanosheet shape. For example, the semiconductor device 200 may include transistors of a Multi Bridge Channel FET (MBCFET™) structure formed by channel layers 240, epitaxial layers 250, and a gate 235G.

The plurality of channel layers 240 may be disposed as two or more, for example, a plurality of channel layers on the active fin 205 to be spaced apart from each other in a direction (Z direction) perpendicular to the upper surface of the active fin 205. The channel layers 240 may be spaced apart from the upper surface of the active fin 205, while being connected to the epitaxial layers 250. The channel layers 240 may have the same or similar width as the active fin 205 in the second direction Y, and may have the same width as or similar width to that of the gate 235G in the first direction X. However, in some embodiments, the channel layers 240 may have a reduced width such that side surfaces are positioned below the gate 235G in the first direction X.

The plurality of channel layers 240 may be formed of a semiconductor material, and may include, for example, silicon (Si), silicon germanium (SiGe), and/or germanium (Ge). The channel layers 240 may be formed of, for example, the same material as the substrate 101. The number and shape of the channel layers 240 constituting one channel structure may be variously changed in example embodiments.

The gate structure 230G may be disposed on the active fin 205 and the plurality of channel layers 240 to extend while intersecting the active fin 205 and the plurality of channel layers 240. Channel regions of transistors may be formed in the active fin 205 and the plurality of channel layers 240 intersecting the gate structure 230G. In this embodiment, a gate dielectric layer 231G may be disposed not only between the active fin 205 and the gate electrode 233G, but also between the plurality of channel layers 240 and the gate electrode 233G. The gate electrode 233G may be disposed on the active fin 205 to fill a space between the plurality of channel layers 240 and to extend over the plurality of channel layers 240. The gate electrode 233G may be spaced apart from the plurality of channel layers 240 with the gate dielectric layer 231G interposed therebetween.

The inner spacers 220 may be disposed in parallel with the gate 235G, between the plurality of channel layers 240. The gate 235G may be spaced apart from the epitaxial layers 250 with the inner spacers 220 disposed therebetween, to electrically separate the gate 235F from the epitaxial layers 250. The inner spacers 220 may have a flat side surface facing the gate 235G or may have an inwardly convexly rounded shape that is inwardly convex toward the gate 235G. The inner spacers 220 may include silicon oxide, silicon nitride, and/or silicon oxynitride. The inner spacers 220 may be omitted in some embodiments.

Figure 8A:
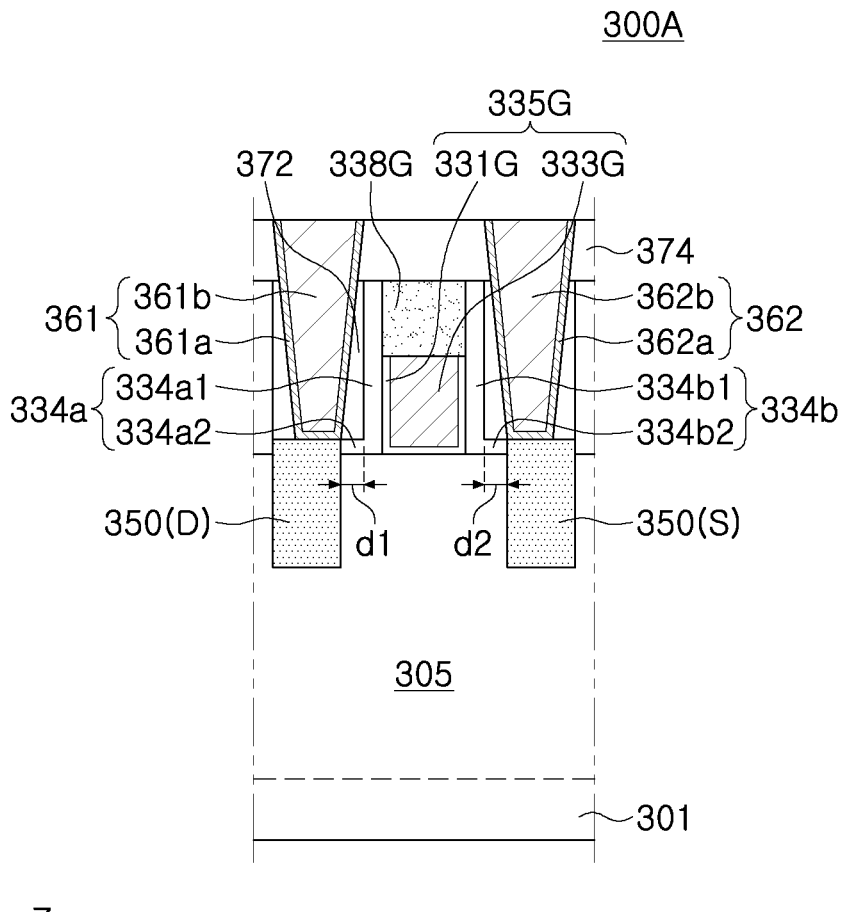
FIGS. 8A to 8C are schematic cross-sectional views of semiconductor devices according to example embodiments.
Figure 8B:
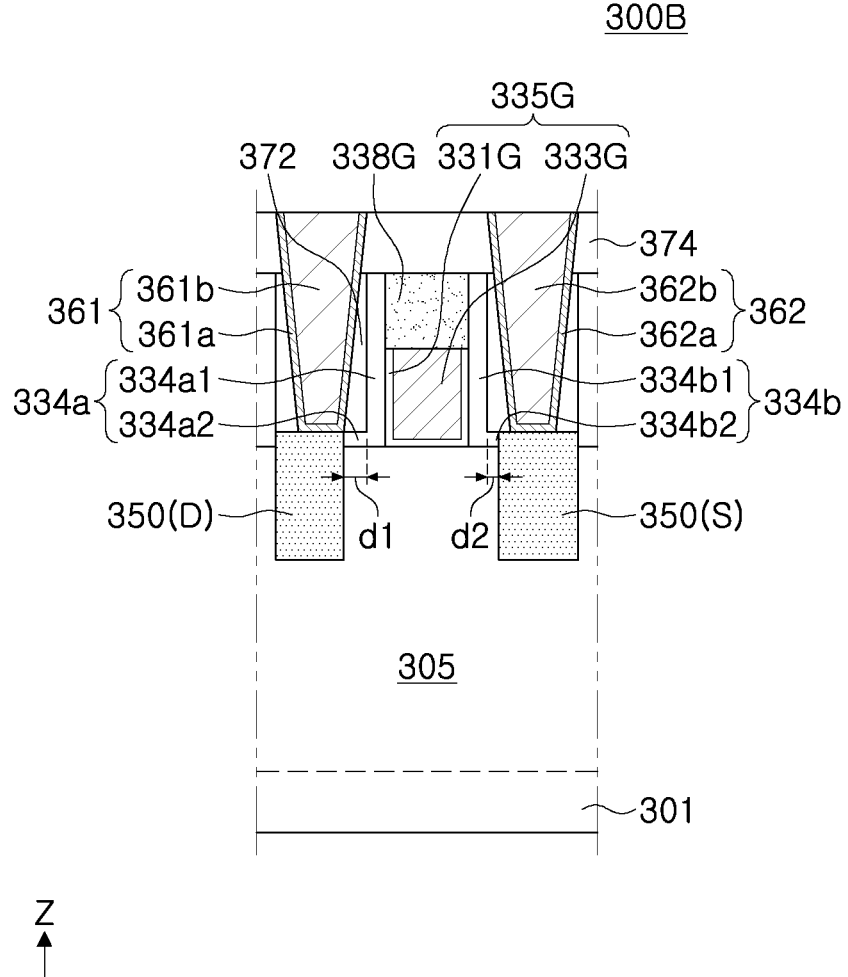
Figure 8C:
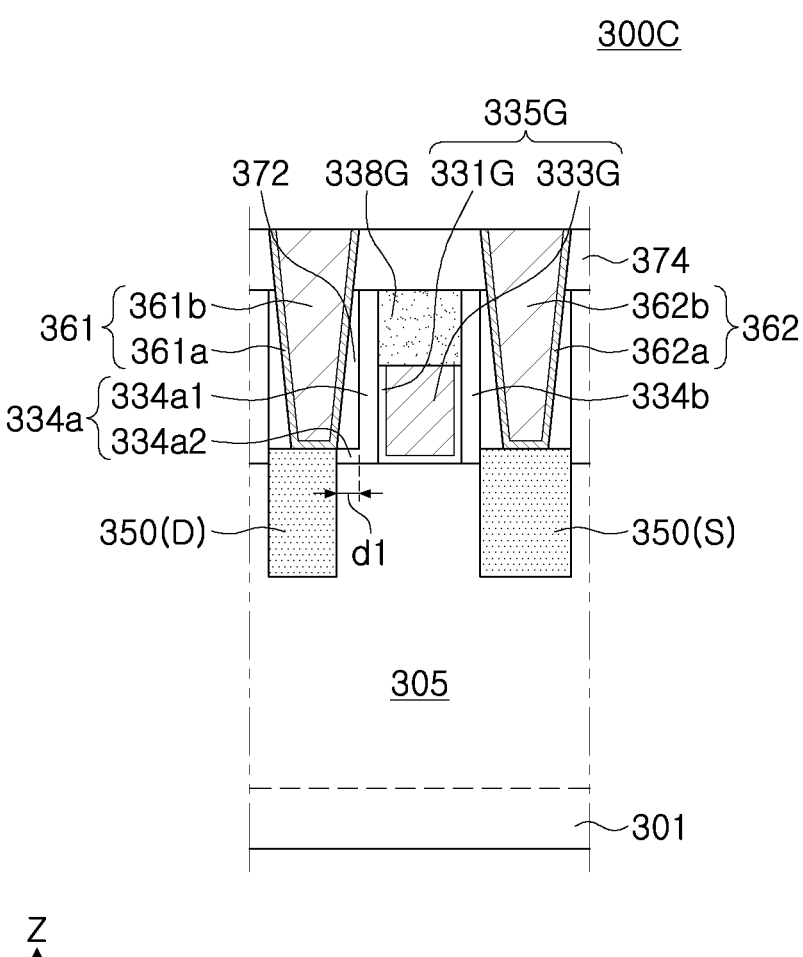

FIGS. 8A to 8C are schematic cross-sectional views of semiconductor devices according to example embodiments. Referring to FIG. 8A, a semiconductor device 300A may include a first spacer 334a and a second spacer 334b disposed on opposite sides of one gate 335G and offset in a direction away from the gate 335G. One of the epitaxial layers 350 disposed on opposite sides of one gate 335G may serve as the source region 350(S), and the other may serve as the drain region 350(D). The first spacer 334a may include a first region 334a1, and a second region 334a2 extending from a lower portion of the first region 334a1 in a direction away from the gate 335G. The second spacer 334b may include a third region 334b1, and a fourth region 334b2 extending from a lower portion of the third region 334b1 in a direction away from the gate 335G. An offset distance D1 of the second region 334a2 in the first direction X may be substantially the same as an offset distance D2 of the fourth region 334b2 in the first direction X.

Referring to FIG. 8B, a semiconductor device 300B is similar to the semiconductor device 600A of FIG. 7A, but the offset distance D1 of the second region 334a2 may be greater than the offset distance D2a of the fourth region 334b2. The first spacer 334a and the second spacer 334b may provide an asymmetrical structure.

Referring to FIG. 8C, a semiconductor device 300C is similar to the semiconductor device 300A of FIG. 7A, but the second spacer 334b does not provide an offset, and only the first spacer 334a might provide an offset second region 334a2.

Figure 9B:
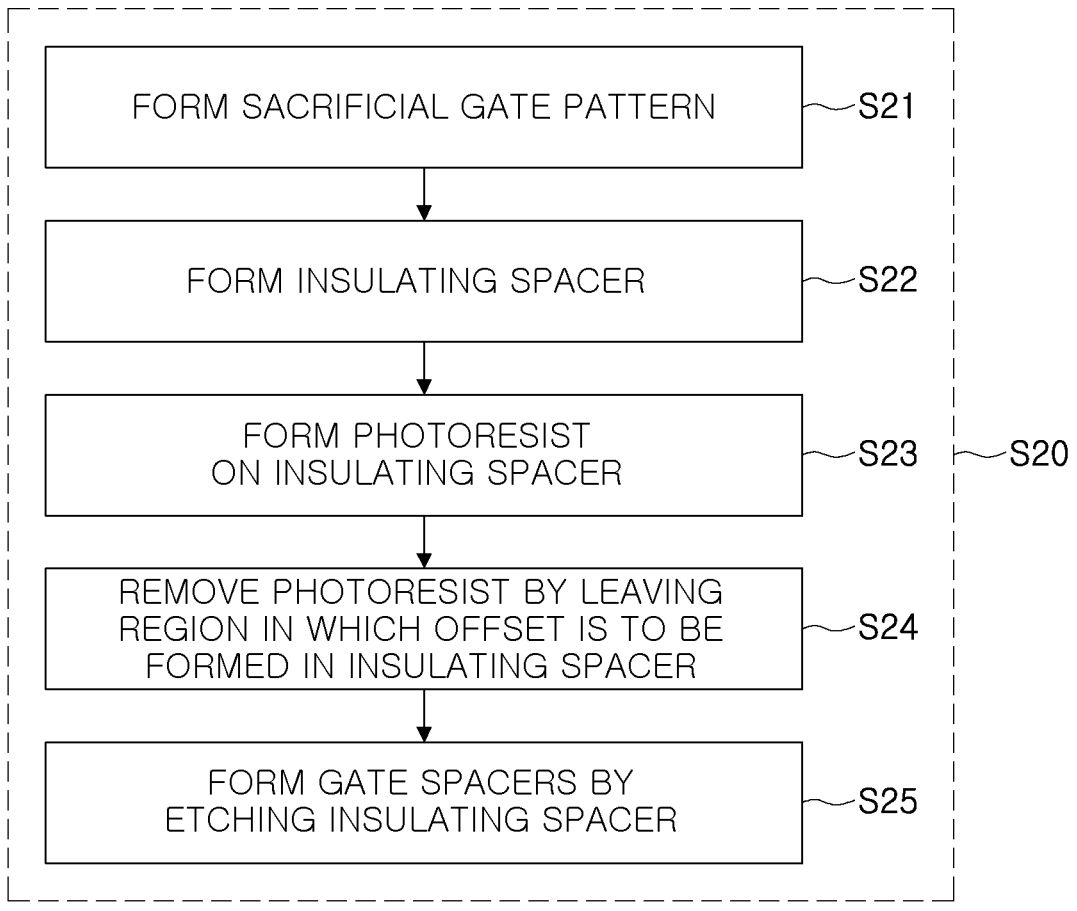

FIGS. 9A and 9B are flowcharts illustrating a method of manufacturing a semiconductor device according to an example embodiment according to a process sequence.

FIGS. 10A to 16 are diagrams illustrating a process sequence to illustrate a method of manufacturing a semiconductor device according to example embodiments.

Referring to FIGS. 9A to 13B, an active fin 105 is formed on a substrate 101 (S10), and a sacrificial gate structure including a sacrificial gate pattern 115 and gate spacers 134, intersecting the active fin 105, may be formed (S20).

Forming the sacrificial gate structure (S20) may include forming a sacrificial gate pattern 115 (S21), forming an insulating spacer (134P) (S22), forming a photoresist 118 on the insulating spacer 134P (S23), removing the photoresist 118 while leaving a region OS in which an offset is to be formed in the insulating spacer 134P (S24), and forming gate spacers 134 by etching the insulating spacer 134P (S25).

First, the substrate 101 is patterned to form a trench defining the active fin 105, and an insulating material fills the region from which a portion of the substrate 101 has been removed, to then be recessed such that the active fin 105 protrudes, thereby forming the device isolation layer 110. The upper surface of the device isolation layer may be lower than the upper surface of the active fin 105. The active fins 105 may have a form protruding further than the upper surface of the device isolation layer 110.

Figure 10A:
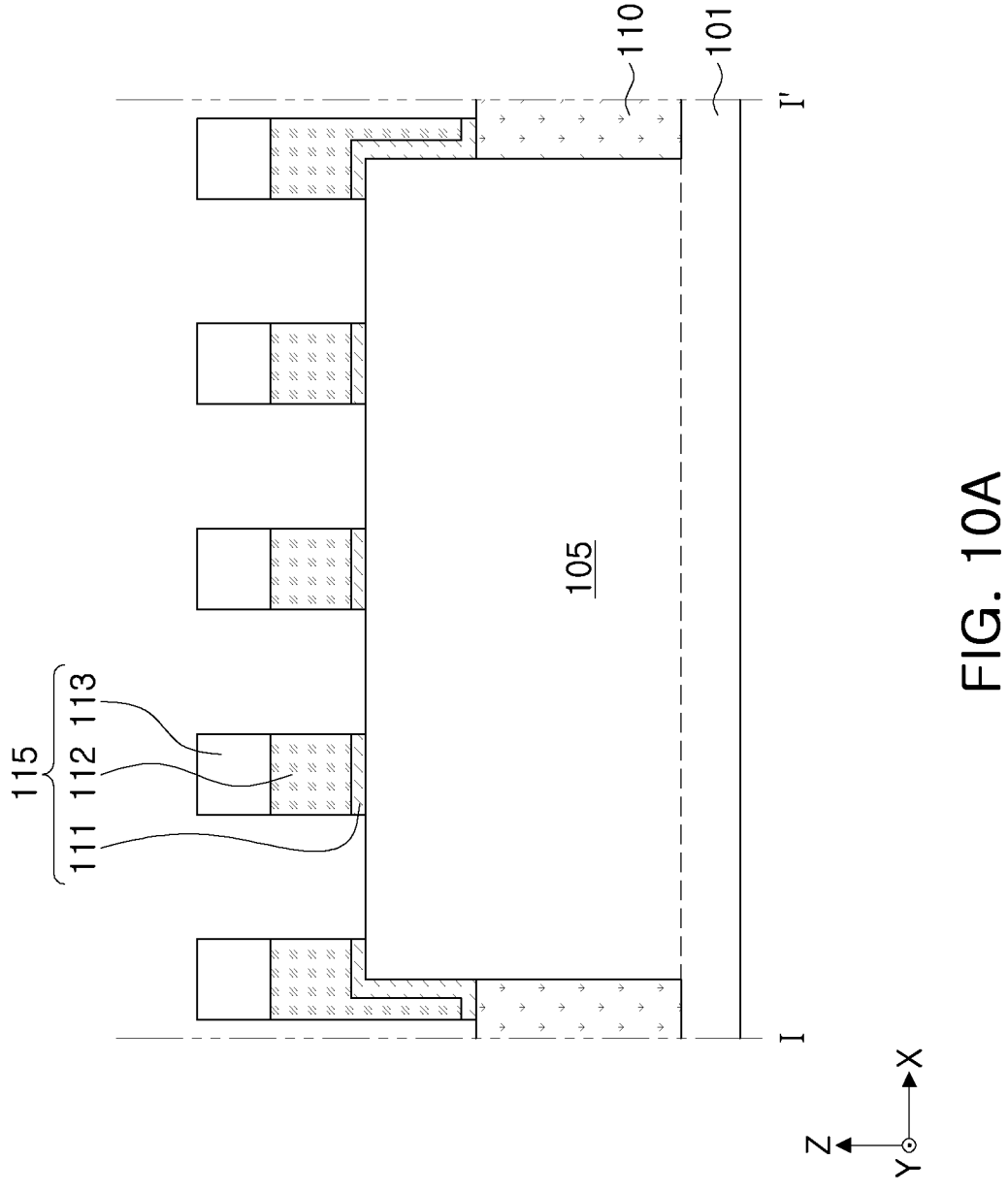
FIGS. 10A, 10B, 11, 12, 13A, 13B, 14A, 14B, 15A, 15B, and 16 are diagrams illustrating a process sequence to illustrate a method of manufacturing a semiconductor device according to example embodiments.
Figure 10B:
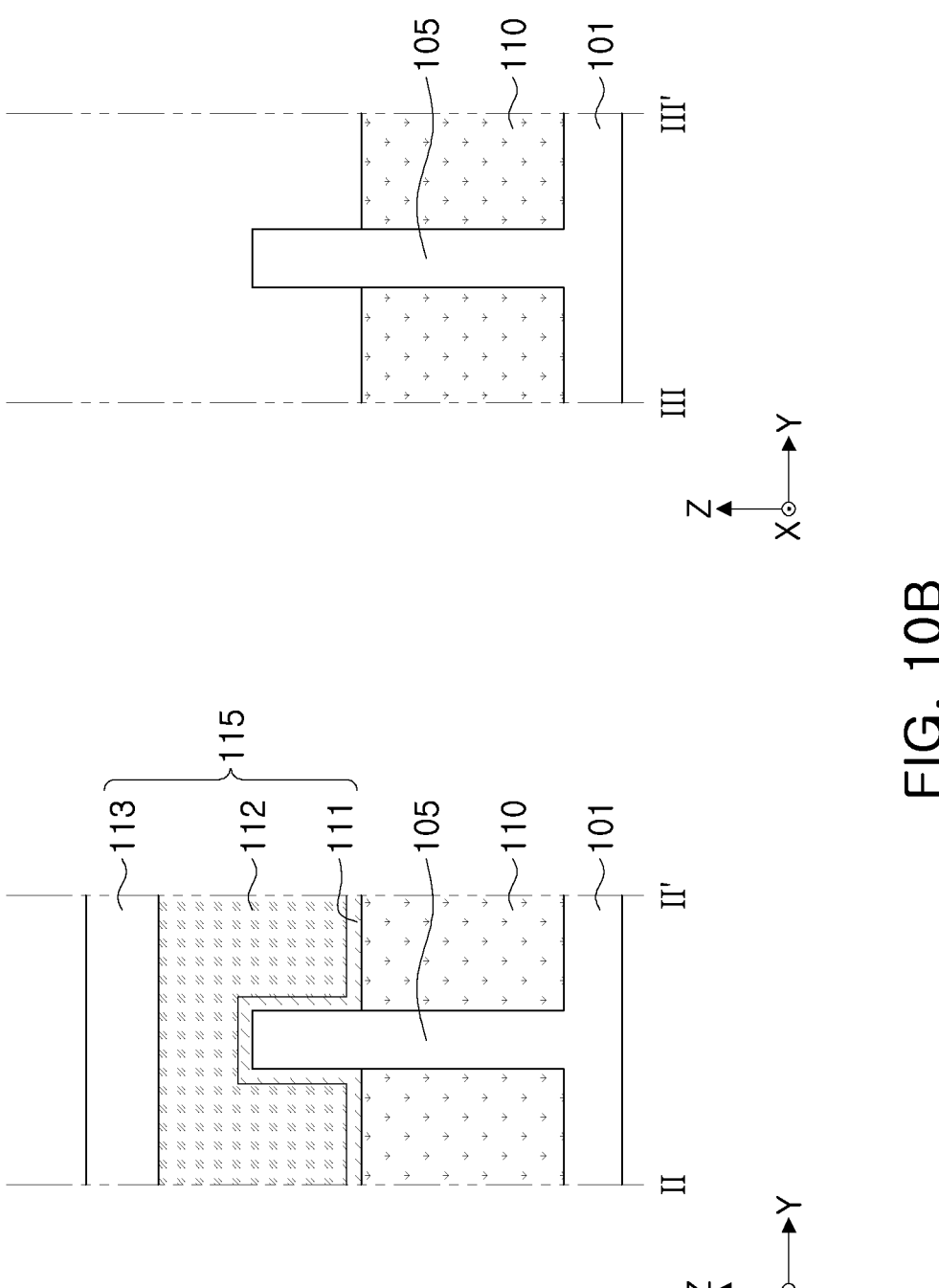

Next, as illustrated in FIGS. 10A and 10B, the sacrificial gate pattern 115 may be formed on the active fin 105 (S21). The sacrificial gate pattern 115 may be a sacrificial structure formed in a region in which the gate electrode 133G is disposed on the active fin 105 as illustrated in FIG. 2 through a subsequent process. The sacrificial gate pattern 115 may intersect the active fin 105 and extend in the second direction (e.g., the Y direction). The sacrificial gate pattern 115 may include first and second sacrificial gate layers 111 and 112 and a mask pattern layer 113 sequentially stacked on the substrate 101. The first and second sacrificial gate layers 111 and 112 may be patterned using the mask pattern layer 113. The first and second sacrificial gate layers 111 and 112 may be an insulating layer and a conductive layer, respectively, but are not necessarily limited thereto, and the first and second sacrificial gate layers 111 and 112 may be formed together as a single layer. For example, the first sacrificial gate layer 111 may include silicon oxide, and the second sacrificial gate layer 112 may include polysilicon. The mask pattern layer 113 may include silicon oxide, silicon nitride, and/or silicon oxynitride.

Figure 11:
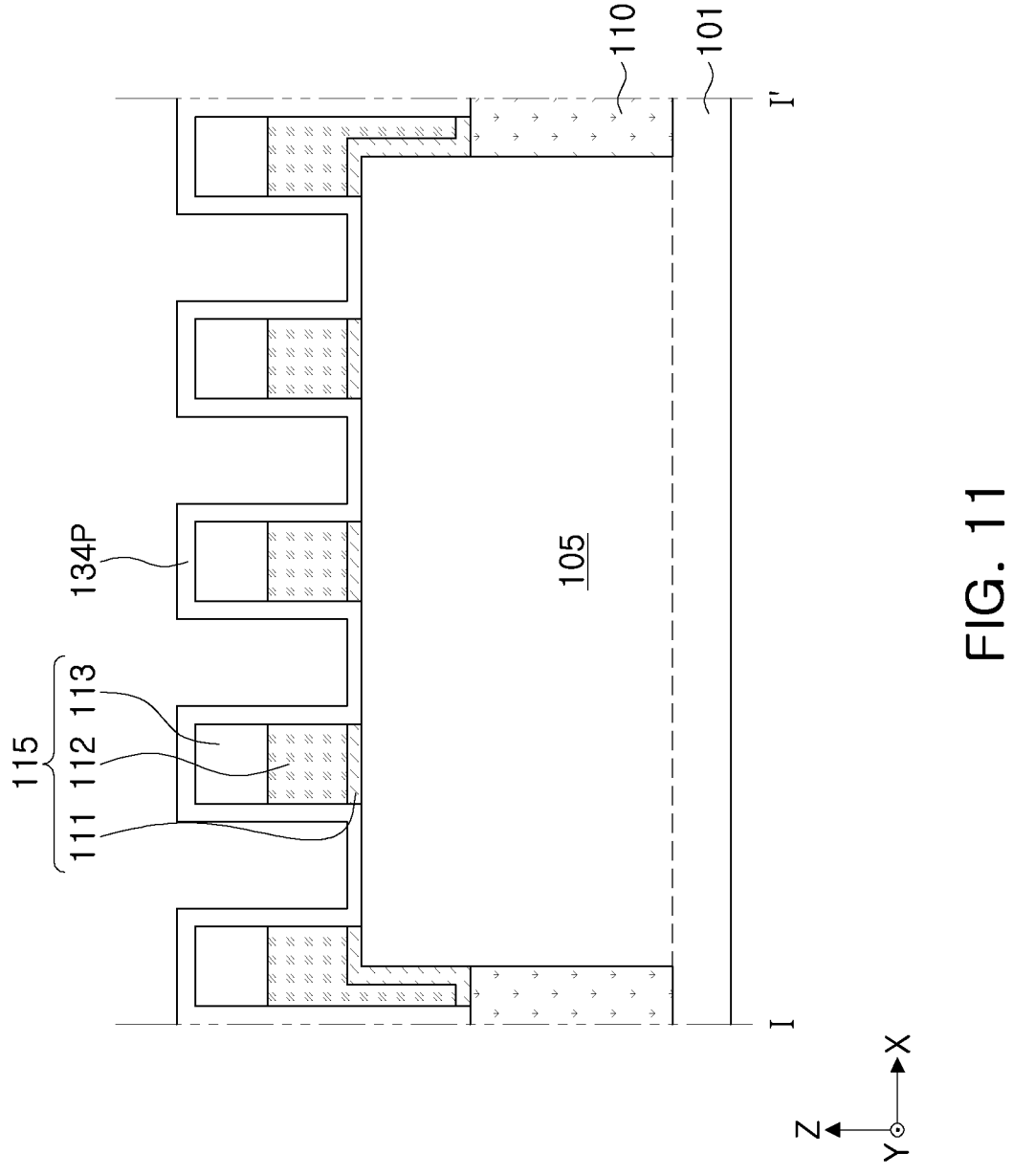

Next, as illustrated in FIG. 11, an insulating spacer 134P may be formed on the active fin 105 and the sacrificial gate pattern 115 (S22). The insulating spacer 134P may be formed by depositing a film having a uniform thickness along the upper and side surfaces of the active fin 105 and the upper and side surfaces of the sacrificial gate pattern 115.

Figure 12:
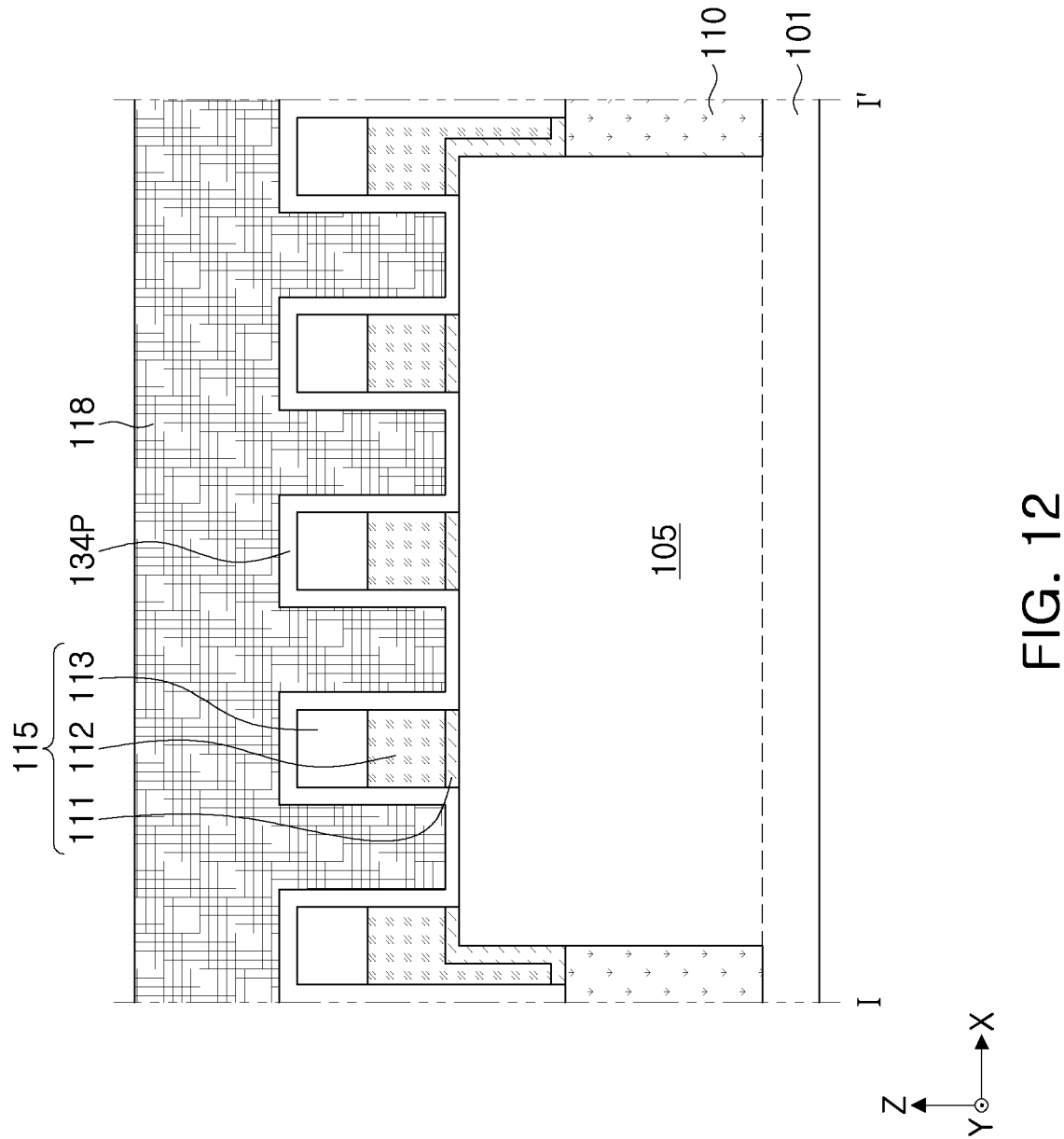

Next, as illustrated in FIG. 12, the photoresist 118 may be formed on the insulating spacer 134P (S23).

Figure 13A:
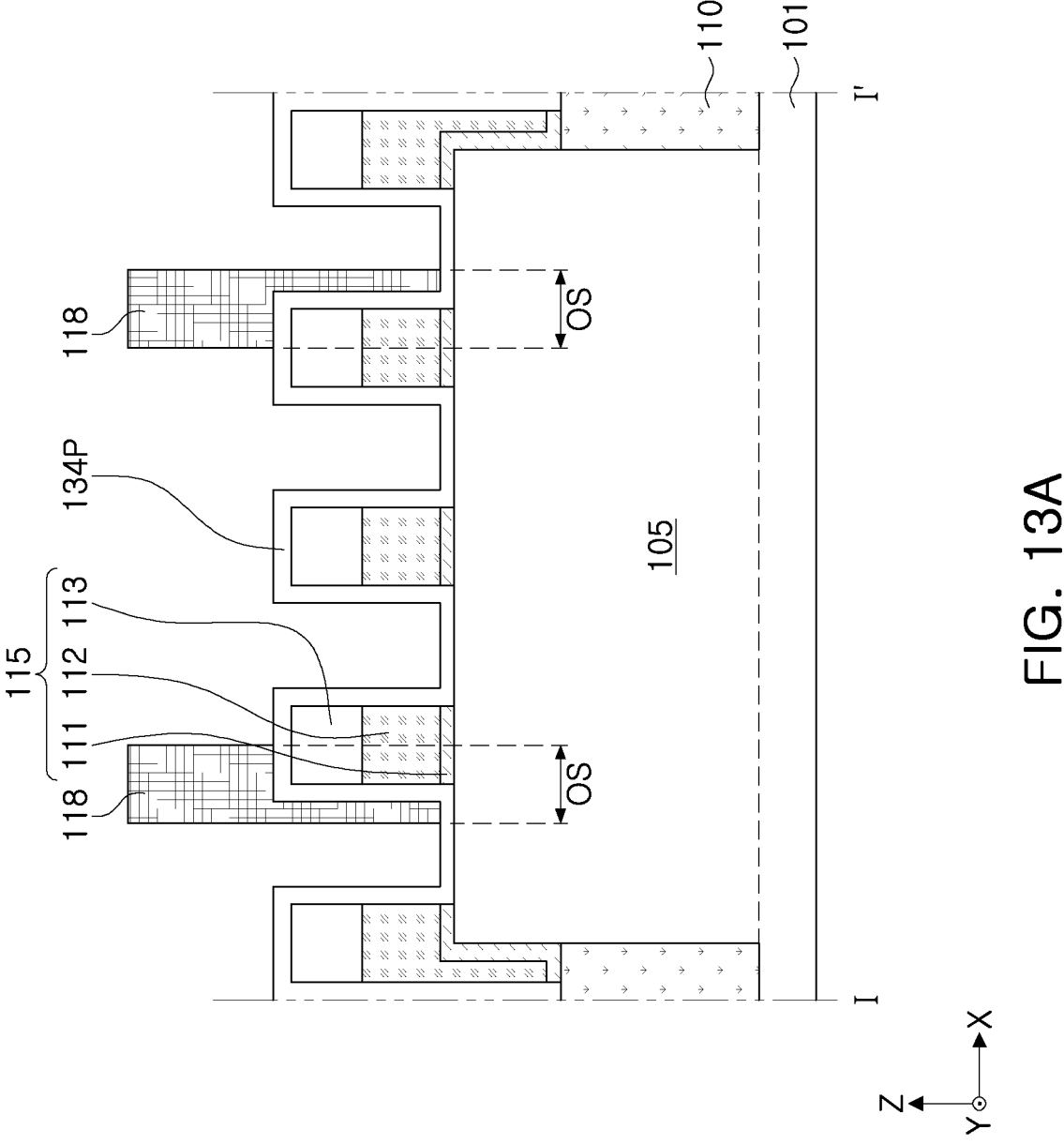
Figure 13B:
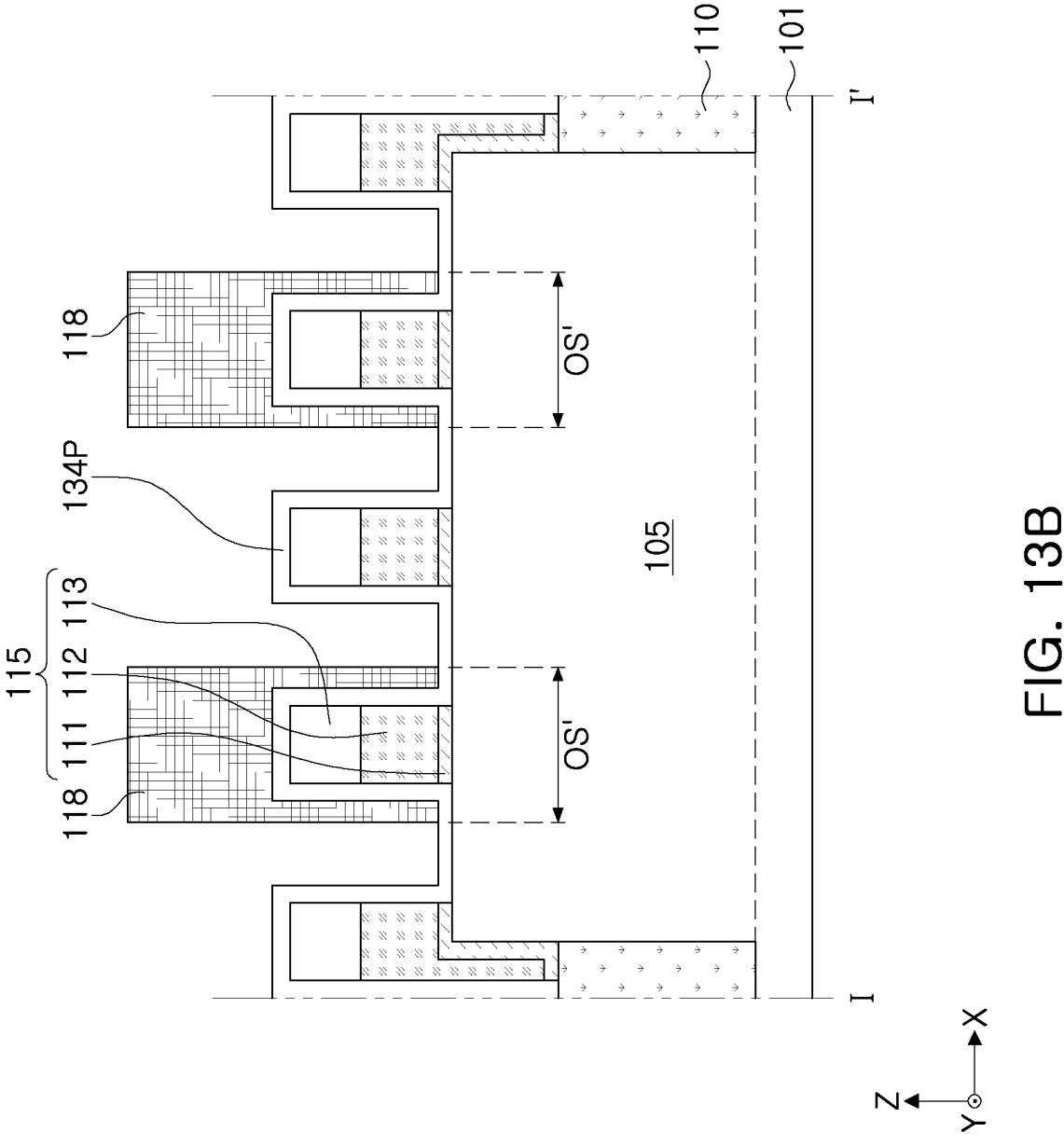

Next, as illustrated in FIG. 13A, an exposure process may be performed using a separate photomask to leave an offset region OS on the insulating spacer 134P and to remove the photoresist 118 (S24). The photoresist 118 may be removed from the area other than the offset region OS by performing an exposure process on the area other than the offset region OS. Alternatively, an exposure process may be performed on the offset region OS, and the photoresist 118 may be removed from a region other than the offset region OS. In FIG. 13A, the remaining photoresist 118 may be offset and disposed on one side of the sacrificial gate pattern 115, and may partially overlap the sacrificial gate pattern 115 on the upper portion of the sacrificial gate pattern 115. In FIG. 13B, an offset region OS' may be formed relatively large, and the remaining photoresist 118 may be disposed on opposite sides of the sacrificial gate pattern 115 and may overlap the sacrificial gate pattern 115 in a vertical direction.

Figure 14A:
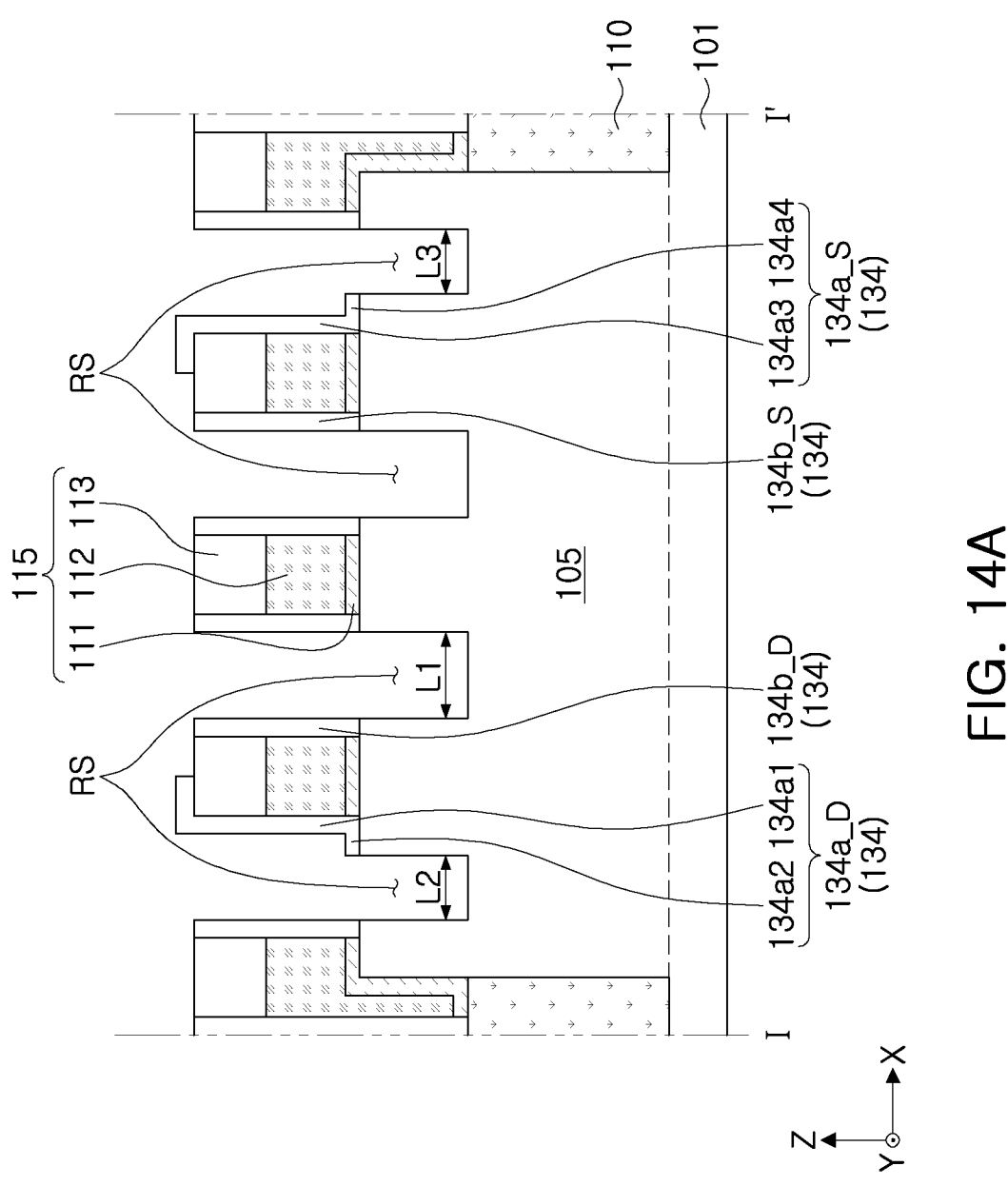

Thereafter, with reference to FIG. 14A below together, as illustrated in FIG. 14A, the insulating spacer 134P may be formed as the gate spacers 134 by performing an anisotropic etching process (S25). When performing the anisotropic etching process, the photoresist 118 on the offset region OS serves as a mask, and thus, an offset bent from a lower portion in a direction away from the sacrificial gate pattern 115 may be formed on the first spacer 134a_D and the third spacer 134a_S. Each of the first spacers 134a_D and the third spacers 134a_S may partially remain on the upper surface of the sacrificial gate pattern 115, but may be removed in a subsequent process.

Figure 14B:
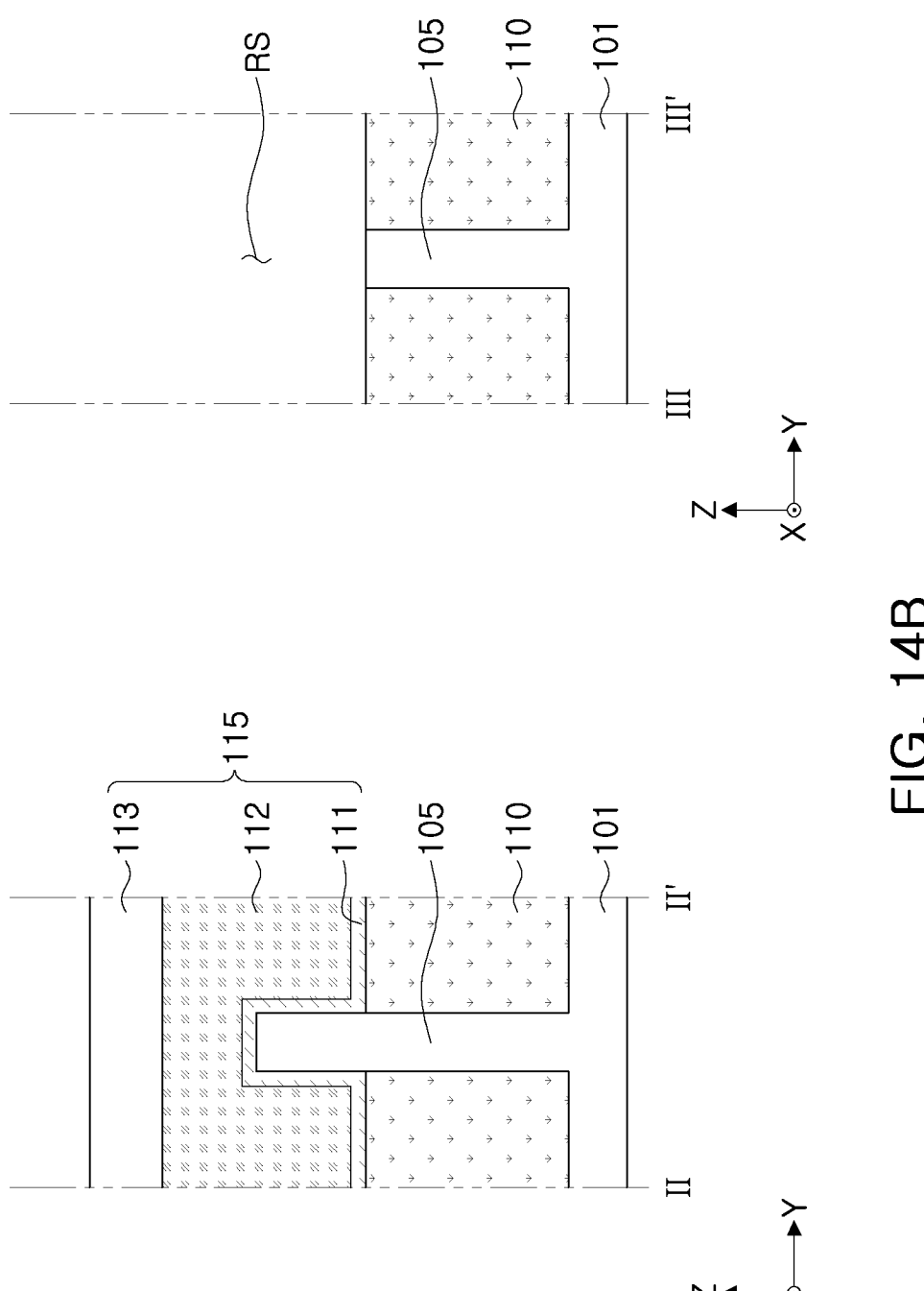

Referring to FIGS. 9A, 14A, and 14B, recess regions RS may be formed in the active fin 105 on opposite sides of the sacrificial gate structure (S30).

The active fin 105 may be partially etched on opposite sides of the sacrificial gate structure to form the recess regions RS. An etching process may be performed using the spacers 134a_D and 134a_S as an etch mask together with the sacrificial gate pattern 115. Due to the offset region OS, some recess regions RS may have a shorter length in the first direction X than other recess regions RS. The recess regions RS may be formed by removing a predetermined depth downwardly from the upper end of the active fin 105. The etch depth of the recess regions RS and the shape of the lower end of the recess regions RS are not necessarily limited to the illustration in the drawings, and may be variously changed according to example embodiments.

Figure 15A:
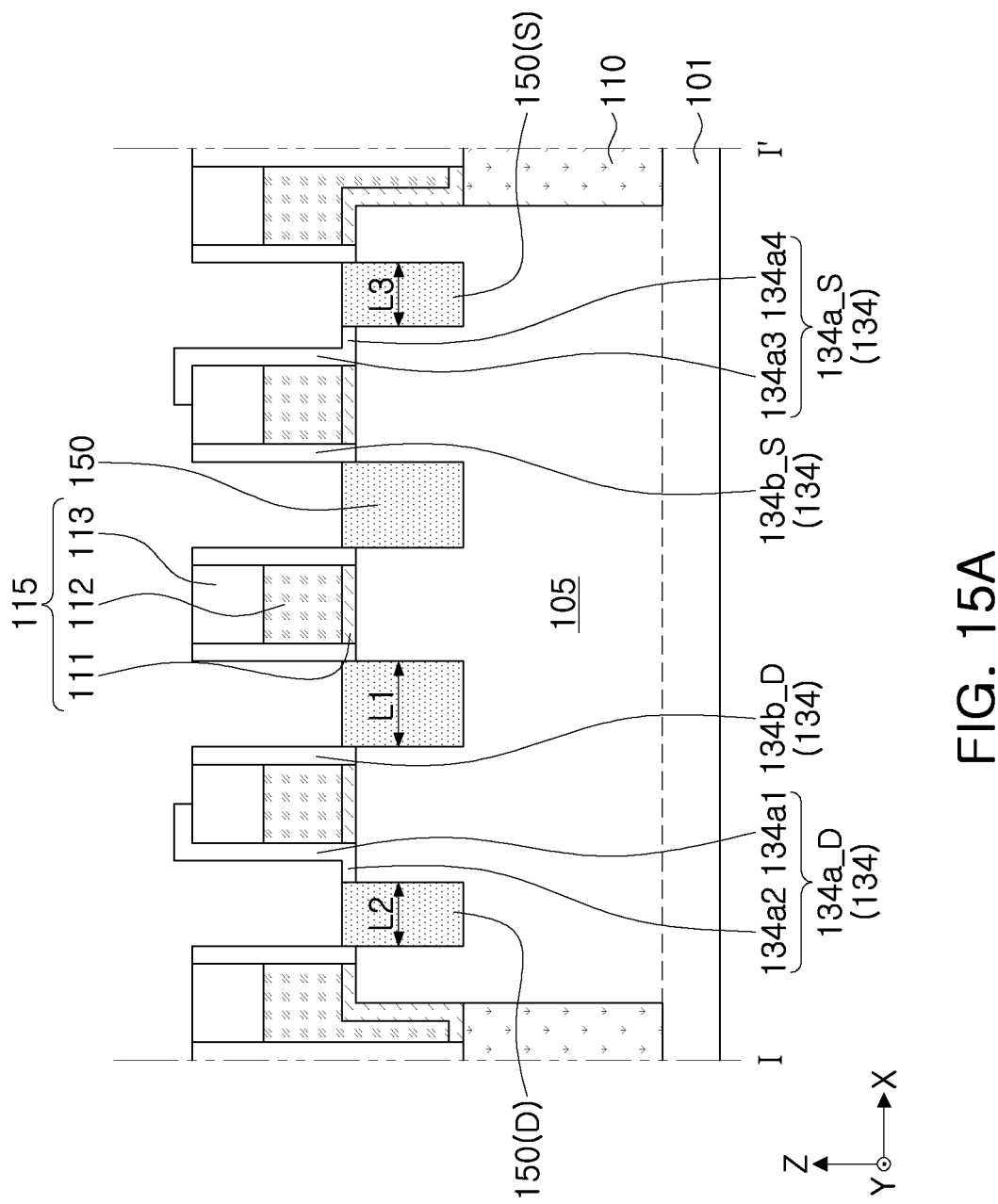
Figure 15B:
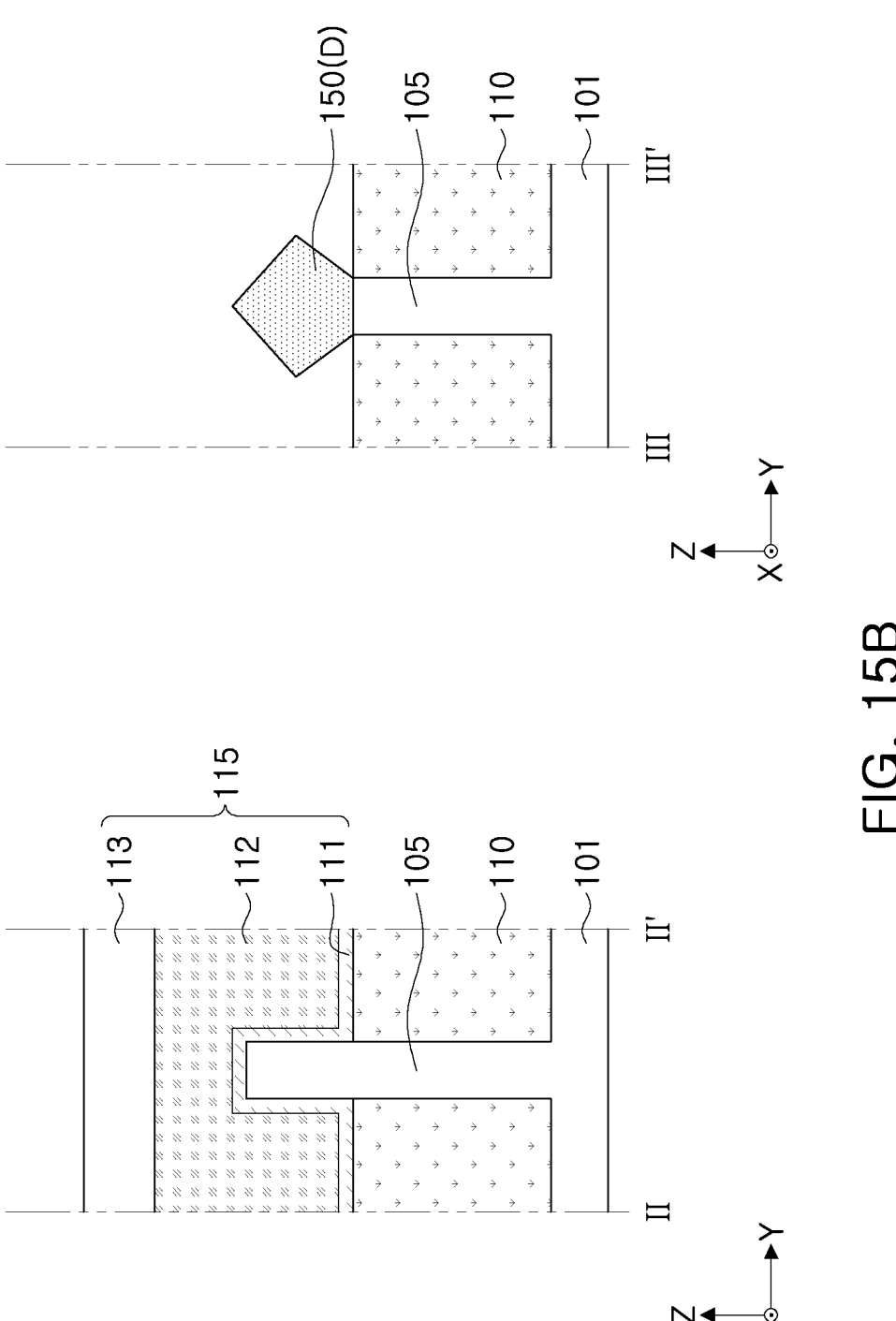

Referring to FIGS. 9A, 15A, and 15B, epitaxial layers 150 including source/drain regions may be formed on the recess regions RS of the active fin 105 (S40).

The epitaxial layers 150 may be formed by performing an epitaxial growth process on the recess regions RS. The epitaxial layers 150 may include impurities by in-situ doping, and may also include a plurality of layers having different doping elements and/or doping concentrations.

Figure 16:
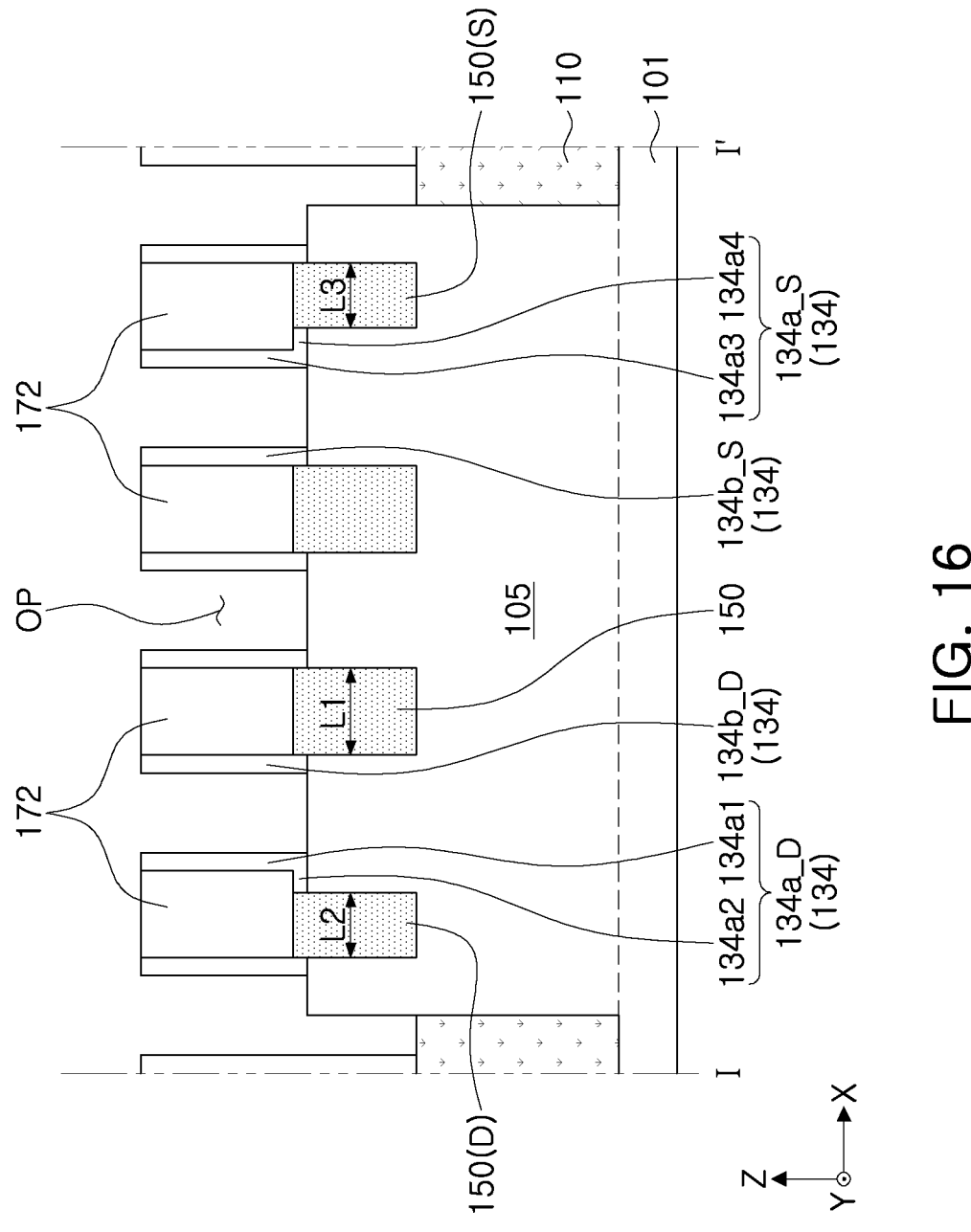

Referring to FIGS. 9A and 16, a first interlayer insulating layer 172 may be formed, and an opening OP may be formed by removing the sacrificial gate pattern 115 (S50).

First, an insulating film may be formed on the sacrificial gate structure and the epitaxial layers 150, and the first interlayer insulating layer 172 may be formed by performing a planarization process so that the upper surface of the mask pattern layer 113 is exposed. Before forming the first interlayer insulating layer 172, an insulating liner may be conformally formed.

Next, the opening OP may be formed by removing the first and second sacrificial gate layers 111 and 112 and the mask pattern layer 113. The first and second sacrificial gate layers 111 and 112 and the mask pattern layer 113 may be selectively removed with respect to the gate spacers 134 and the first interlayer insulating layer 172.

Referring to FIGS. 9A, 2A, and 2B, a gate structure 130 may be formed by depositing a gate dielectric layer 131 and a gate electrode 133 in the opening OP (S60), and contacts 161 and 162 connected to epitaxial layers including source/drain regions may be formed (S70).

The gate dielectric layer 131 may conformally cover the upper surface of the active fin 105 and the gate spacers 134 in the opening OP. Forming the gate electrode 133 may include sequentially forming a plurality of metal layers on the gate dielectric layer 131. Accordingly, the gate structure 130 including the gate electrode 133, the gate dielectric layer 131, and the gate spacers 134 may be formed. In this operation, a dummy gate structure 130D may be formed together with the gate structure 130.

The contacts may be formed by forming a contact opening exposing the epitaxial layers 150 by penetrating through the interlayer insulating layer 172 and then depositing a conductive material in the contact opening.

Figure 17:
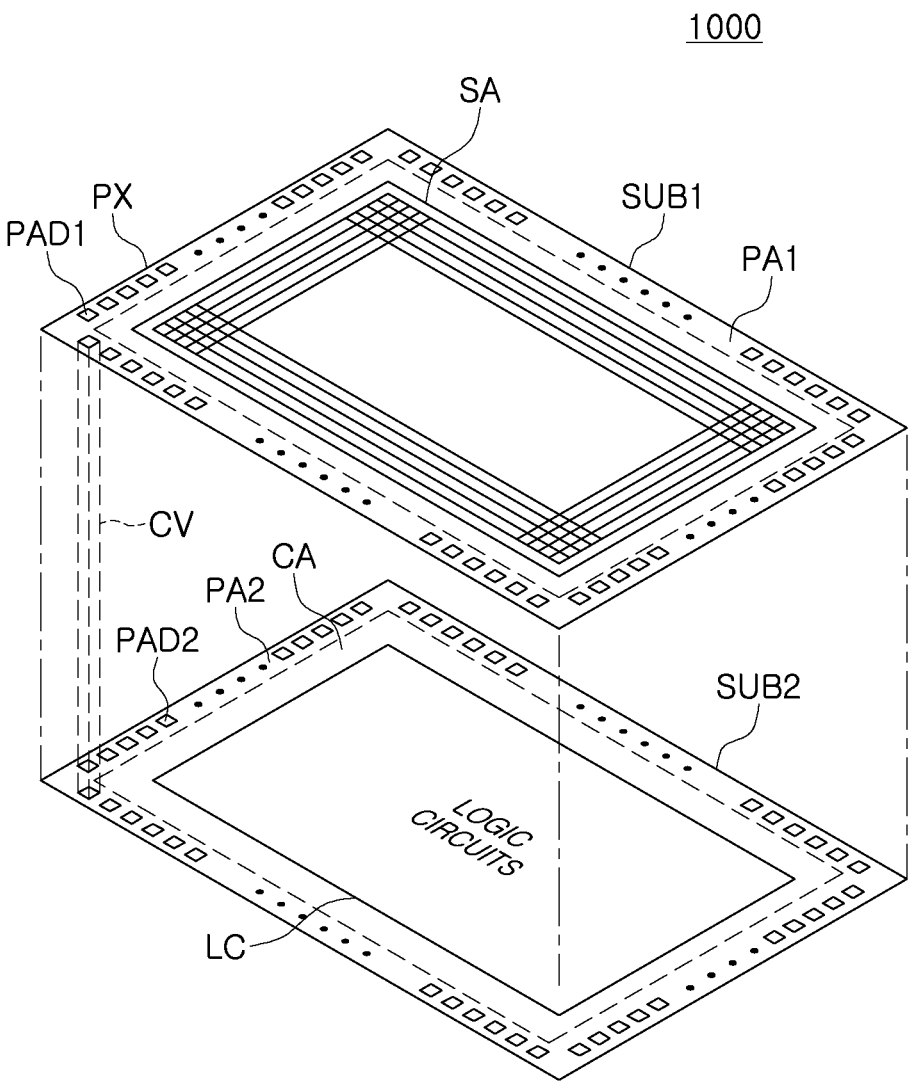
FIG. 17 is an exploded perspective view illustrating a CMOS image sensor including transistors of a semiconductor device according to example embodiments.

FIG. 17 is an exploded perspective view illustrating a CMOS image sensor including transistors of a semiconductor device according to example embodiments.

Referring to FIG. 17, an image sensor 1000 may be a stacked image sensor including a first substrate SUB1 and a second substrate SUB2 stacked in a vertical direction. The first substrate SUB1 may include a sensing area SA and a first pad area PA1, and the second substrate SUB2 may include a circuit area CA and a second pad area PA2. The sensing area SA may include a plurality of pixels PX arranged in a plurality of row lines and a plurality of column lines. The first pad area PA1 includes a plurality of first pads PAD1, and the plurality of first pads PAD1 may be configured to transmit and receive electrical signals with the circuit area CA of the second substrate SUB2 and the second pad area PA2. The circuit area CA may include a logic circuit block LC, and may include a plurality of circuit elements constituting a row driver, a read-out circuit, a column driver, and the like. The circuit area CA may provide a plurality of control signals to the sensing area SA to control outputs from the plurality of pixels PX.

The first pads PAD in the first pad area PA1 may be electrically connected to the second pads PAD2 in the second pad area PA2 by a connection portion CV. The structure of the image sensor 1000 is not necessarily limited to that illustrated in FIG. 16 and may be variously modified according to example embodiments. For example, the image sensor 1000 may further include at least one substrate provided below the second substrate SUB2 and including a memory chip such as DRAM or SRAM.

According to an example, a transistor of a semiconductor device manufactured according to an example embodiment of the present inventive concept may be applied to the plurality of circuit elements in the circuit area CA included in the second substrate SUB2 of the image sensor 1000. According to an example, the semiconductor device manufactured according to the present inventive concept may be applied to an ADC converter, an RF device, an I/O device, and the like. However, application examples of the semiconductor device manufactured according to the present inventive concept are not necessarily limited thereto.

Figure 18:
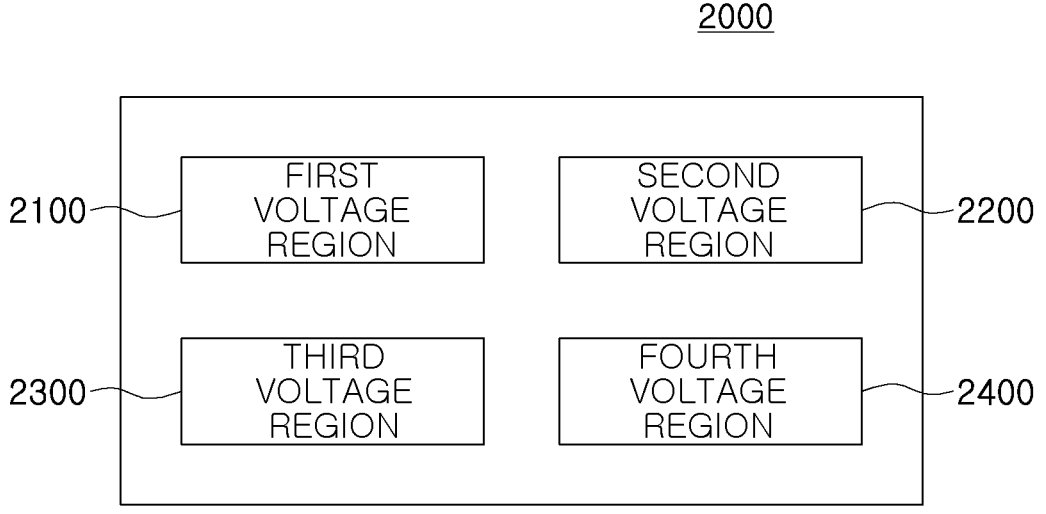
FIG. 18 is a diagram schematically illustrating a substrate structure in which transistors of a semiconductor device are formed, according to example embodiments.

FIG. 18 is a diagram schematically illustrating a substrate structure in which transistors of a semiconductor device are formed, according to example embodiments.

Referring to FIG. 18, a substrate structure 2000 in which transistors of a semiconductor device according to example embodiments are formed may be a lower plate of a CMOS image sensor. The substrate structure 2000 may include, for example, a plurality of voltage regions 2100, 2200, 2300, and 2400 to which different driving voltages are provided. Accordingly, the driving voltage applied to any one of the plurality of voltage regions 2100, 2200, 2300, and 2400 may be higher or lower than the driving voltage applied to the other voltage region. The plurality of voltage regions 2100, 2200, 2300, and 2400 may include a first voltage region 2100, a second voltage region 2200, a third voltage region 2300, and a fourth voltage region 2400. Each of the plurality of voltage regions 2100, 2200, 2300, and 2400 may include a plurality of transistors.

In an example embodiment, the driving voltage of the plurality of first transistors disposed in the first voltage region 2100 may be about 0.8 V, or may range from about 0.6 V to about 1.0 V. The driving voltage of the plurality of second transistors disposed in the second voltage region 2200 may be about 1.8 V, or may have a range of about 1.6 V to about 2.0 V. The driving voltage of the plurality of third transistors disposed in the third voltage region 2300 may be about 2.2 V, or may have a range of about 2.0 V to about 2.4 V. The driving voltage of the plurality of fourth transistors disposed in the fourth voltage region 2400 may be about 3.3 V, or may have a range of about 3.1 V to about 3.5 V. However, a detailed numerical range of the driving voltage is only an example, and the driving voltage in each of the plurality of voltage regions 2100, 2200, 2300, and 2400 may be provided as a value different from the above example.

In an example embodiment, the plurality of transistors included in each of the plurality of voltage regions 2100, 2200, 2300, and 2400 may have different driving voltages for respective voltage regions. The plurality of transistors included in any one voltage region may be transistors capable of being driven by a driving voltage in the corresponding voltage region.

FIG. 19 is a flowchart illustrating a process sequence to illustrate a method of manufacturing a semiconductor device according to example embodiments. Similar to the substrate structure 2000 of FIG. 17, FIG. 18 illustrates an example of a process of forming a transistor on a low voltage region and a transistor on a high voltage region together, in the plurality of voltage regions 2100, 2200, 2300, and 2400 driven by different driving voltages.

Referring to FIG. 19, a first active fin on a low voltage region and a second active fin on a high voltage region may be formed (S100). The high voltage region may correspond to, for example, the fourth voltage region 2400 of FIG. 18, and the low voltage region may correspond to, for example, the first voltage region 2100 of FIG. 18. The first active fin and the second active fin may extend in the first direction by patterning the substrate. The first active fin and the second active fin may be formed in the same process operation, for example, at the same time, but the present inventive concept is not necessarily limited thereto.

A first sacrificial gate pattern intersecting the first active fin and a second sacrificial gate pattern intersecting the second active fin may be formed (S200). The first sacrificial gate pattern and the second sacrificial gate pattern may extend in a second direction perpendicular to the first direction. The first sacrificial gate pattern and the second sacrificial gate pattern may be formed together in a single process operation, for example, at the same time, but the present inventive concept is not necessarily limited thereto.

First insulating spacers may be formed on opposite sides of the first sacrificial gate pattern and second insulating spacers may be formed on opposite sides of the second sacrificial gate pattern (S300). The first and second insulating spacers may be formed by depositing a film having a uniform thickness covering the first and second active fins and the first and second sacrificial gate patterns.

A photoresist is formed on a substrate, and the photoresist is left on a portion of the second insulating spacer while removing the photoresist, and then, a gate spacer having an offset may be formed on at least one side of the second sacrificial gate pattern, on the high voltage region, by etching the first and second insulating spacers (S400). To reduce occurrence of GIDL and hot carriers by reducing a maximum electric field in the transistor to which the high voltage is applied, the photoresist may remain on a portion in which the second insulating spacer horizontally extends along the upper surface of the second active fin, on one side of the second sacrificial gate pattern in the high voltage region. In an anisotropic etching process to form gate spacers, the remaining photoresist may be formed as a gate spacer (see 134*a*_D in FIG. 2A) having a region in which the second insulating spacer has been offset.

First recess regions may be formed by etching the first active fins on opposite sides of the first sacrificial gate pattern, and second recess regions may be formed by etching the second active fins on opposite sides of the second sacrificial gate pattern (S500). The first recess regions may be formed by partially etching the first active fins and removing the first active fins by a predetermined depth downwardly from the upper ends of the first active fins. The second recess regions may be formed as the second active fins are partially etched and removed by a predetermined depth downwardly from the upper ends of the second active fins. The first recess regions and the second recess regions may be formed in the same process operation, e.g., at the same time, but the present inventive concept is not necessarily limited thereto.

By performing an epitaxial growth process and an in-situ doping process of doping an impurity element, the first epitaxial layers on the first recess regions and second epitaxial layers on the second recess regions may be formed (S600). The first epitaxial layers and the second epitaxial layers may be formed as epitaxial layers by performing an epitaxial growth process from the first recess regions and the second recess regions. The first epitaxial layers and the second epitaxial layers may be formed in the same process operation, for example, at the same time, but the present inventive concept is not necessarily limited thereto.

Thereafter, referring to FIG. 9A together, openings are formed by removing the first and second sacrificial gate patterns, and a gate structure is formed by depositing a gate dielectric layer and a gate electrode in the openings, and contacts connected to the first and second epitaxial layers may be formed.

As set forth above, by forming an offset in the spacer between the epitaxial layer and the gate in a transistor to which a high voltage is applied as a driving voltage, a semiconductor device having desirable electrical characteristics and greater reliability by reducing or significantly decreasing a Gate Induced Drain Leakage (GIDL) phenomenon and occurrence of hot carriers of a transistor may be provided.

While example embodiments have been illustrated and described above, it will be apparent to those skilled in the art that modifications and variations could be made without departing from the scope of the present inventive concept.

What is claimed is:

1. A semiconductor device, comprising:
an active fin protruding from a substrate and extending in a first direction;
a device isolation layer defining the active fin in the substrate and covering a portion of a side surface of the active fin;
a plurality of gate structures intersecting the active fin and extending in a second direction, perpendicular to the first direction, each of the plurality of gate structures including a gate and gate spacers on side surfaces of the gate; and
a plurality of epitaxial layers disposed on the active fin, on opposite sides of each of the plurality of gate structures, and including a first epitaxial layer providing a drain region and a second epitaxial layer providing a source region,
wherein the gate spacers include a first spacer positioned between the first epitaxial layer and a first gate of a first gate structure and a second spacer located on an opposite side of the first spacer, with the first gate of the first gate structure disposed between the first and second spacers,
wherein the first spacer includes a first region extending in a third direction, perpendicular to an upper surface of the substrate, along a first side surface of the first gate of the first gate structure, and a second region extending from a lower portion of the first region in a direction away from the first gate of the first gate structure,
wherein the second spacer extends in the third direction along a second side surface of the first gate of the first gate structure,
wherein the plurality of epitaxial layers further includes one or more third epitaxial layers disposed between the first epitaxial layer and the second epitaxial layer, and
wherein a length of at least one of the first epitaxial layer or the second epitaxial layer in the first direction is different from a length of the one or more of third epitaxial layers in the first direction.

2. The semiconductor device of claim 1, wherein the first epitaxial layer is spaced apart from the first gate of the first gate structure by an offset distance by the first spacer.

3. The semiconductor device of claim 2, wherein a length of the second region of the first spacer offsetting the first epitaxial layer from the first gate of the first gate structure, in the first direction, is in a range of about 1 nm to about 50 nm.

4. The semiconductor device of claim 1, wherein an impurity element doped on the first epitaxial layer and an impurity element doped on the second epitaxial layer have a same conductivity type.

5. The semiconductor device of claim 1, wherein one of the plurality of epitaxial layers disposed between the plurality of gate structures has a first length in the first direction, and
wherein the first epitaxial layer has a second length that is less than the first length in the first direction.

6. The semiconductor device of claim 1, wherein the gate includes a gate dielectric layer on the active fin and a gate electrode on the gate dielectric layer, and wherein a thickness of the gate dielectric layer ranges from about 1.5 nm to about 10 nm.

7. The semiconductor device of claim 1, wherein a driving voltage in a range of about 1.2 V to about 50 V is applied to the first epitaxial layer.

8. The semiconductor device of claim 1, wherein the gate spacers further include a third spacer disposed between the second epitaxial layer and a second gate of a second gate structure, and wherein the third spacer includes a third region extending in the third direction along a third side surface of the second gate of the second gate structure, and a fourth region extending from a lower portion of the third region in a direction away from the second gate of the second gate structure.

9. The semiconductor device of claim 8, wherein in the first direction, a length of the fourth region and a length of the second region are different from each other.

10. The semiconductor device of claim 1, further comprising a plurality of channel layers disposed on the active fin and spaced apart from each other in the third direction, at least partially surrounded by the gate, and connected to the plurality of epitaxial layers.

11. The semiconductor device of claim 1, further comprising:

a first contact connected to the first epitaxial layer and configured to apply a first voltage to the first epitaxial layer; and a second contact connected to the second epitaxial layer and configured to apply a second voltage that is lower than the first voltage to the second epitaxial layer.

12. A semiconductor device, comprising:

an active fin protruding from a substrate and extending in a first direction;

a device isolation layer defining the active fin in the substrate and covering a portion of a side surface of the active fin;

a plurality of gate structures intersecting the active fin and extending in a second direction, perpendicular to the first direction;

a first epitaxial layer disposed on a first recess region of the active fin that is outside of a first gate structure, among the plurality of gate structures;

a second epitaxial layer disposed on a second recess region of the active fin that is outside of a second gate structure, among the plurality of gate structures; and one or more third epitaxial layers disposed on one or more third recess regions on the active fin, between the first gate structure and the second gate structure, wherein each of the plurality of gate structures includes a gate and gate spacers disposed on side surfaces of the gate, wherein, among the gate spacers, a first gate spacer in contact with the first epitaxial layer includes a first region extending in a third direction, perpendicular to an upper surface of the substrate, and a second region bent from a lower portion of the first region and extending toward the first epitaxial layer, and wherein a length of the first epitaxial layer in the first direction is shorter than a length of the one or more third epitaxial layers in the first direction.

13. The semiconductor device of claim 12, wherein a length of the second epitaxial layer in the second direction is shorter than the length of the one or more third epitaxial layers in the first direction.

14. The semiconductor device of claim 12, wherein the length of the first epitaxial layer in the second direction is different from a length of the second epitaxial layer in the second direction.

15. The semiconductor device of claim 12, wherein the first epitaxial layer and the second epitaxial layer form a mirror-symmetric structure with respect to a center of the one or more third epitaxial layers.

16. The semiconductor device of claim 12, wherein the first epitaxial layer and the second epitaxial layer form an asymmetrical structure with respect to a center of the one or more third epitaxial layers.

17. A semiconductor device, comprising:

an active fin protruding from a substrate and extending in a first direction;

a device isolation layer defining the active fin in the substrate and covering a portion of a side surface of the active fin;

a first gate structure intersecting the active fin and extending in a second direction, perpendicular to the first direction;

a second gate structure intersecting the active fin and extending in the second direction, the second gate structure spaced apart from the first gate structure in the first direction;

a first dummy gate structure extending in the second direction and disposed adjacent to the first gate structure;

a second dummy gate structure extending in the second direction and adjacent to the second gate structure;

a first epitaxial layer disposed on a first recess region of the active fin, between the first gate structure and the first dummy gate structure;

a second epitaxial layer disposed on a second recess region of the active fin, between the second gate structure and the second dummy gate structure; and one or more third epitaxial layers disposed between the first epitaxial layer and the second epitaxial layer, wherein the first gate structure includes a first gate, and a first gate spacer disposed on one side surface adjacent to the first dummy gate structure, among side surfaces of the first gate, wherein the first gate spacer includes a first region extending in a third direction, perpendicular to an upper surface of the substrate, and a second region extending from a lower portion of the first region toward the first dummy gate structure, wherein the first epitaxial layer is disposed between the first dummy gate structure and the second region, and wherein a length of at least one of the first epitaxial layer or the second epitaxial layer in the first direction is different from a length of the one or more of third epitaxial layers in the first direction.

18. The semiconductor device of claim 17, wherein a distance between the first dummy gate structure and the second gate structure is greater than a distance between the first dummy gate structure and the first gate structure, in the first direction, wherein the second gate structure includes a second gate, and a second gate spacer disposed on one side surface adjacent to the second dummy gate structure from among side surfaces of the second gate, wherein the second gate spacer includes a third region extending in the third direction and a fourth region extending from a lower portion of the third region toward the second dummy gate structure, and wherein the second epitaxial layer is disposed between the second dummy gate structure and the fourth region.

\*    \*    \*    \*    \*